United States Patent
HuangFu et al.

(10) Patent No.: US 12,323,167 B2
(45) Date of Patent: Jun. 3, 2025

(54) CHANNEL ENCODING AND DECODING METHOD AND COMMUNICATION APPARATUS

(71) Applicant: Huawei Technologies Co., Ltd., Guangdong (CN)

(72) Inventors: Yourui HuangFu, Hangzhou (CN); Huazi Zhang, Hangzhou (CN); Jian Wang, Hangzhou (CN); Rong Li, Hangzhou (CN); Jun Wang, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 242 days.

(21) Appl. No.: 18/067,244

(22) Filed: Dec. 16, 2022

(65) Prior Publication Data

US 2023/0123083 A1 Apr. 20, 2023

Related U.S. Application Data

(63) Continuation of application No. PCT/CN2021/096302, filed on May 27, 2021.

(30) Foreign Application Priority Data

Jun. 17, 2020 (CN) .......................... 202010556048.6

(51) Int. Cl.
  *H03M 1/22* (2006.01)
  *H03M 5/14* (2006.01)
  *H03M 13/03* (2006.01)
  *H03M 13/25* (2006.01)

(52) U.S. Cl.
  CPC ........... *H03M 5/14* (2013.01); *H03M 13/036* (2013.01); *H03M 13/255* (2013.01)

(58) Field of Classification Search
  CPC ..... H03M 7/3059; G06N 3/045; G06N 20/00; G06N 3/042; G06N 3/08; G06N 3/044;
  (Continued)

(56) References Cited

U.S. PATENT DOCUMENTS 8,508,079 B1 * 8/2013 Corrado ................... H02J 5/00
                                                      307/131
9,941,900 B1 * 4/2018 Horn ................... H03M 7/6088
(Continued)

FOREIGN PATENT DOCUMENTS

CN        101584143 A      11/2009
CN        109194425 A       1/2019
(Continued)

OTHER PUBLICATIONS

Samsung et al.,"Discussion on Flexible Polar Codes",3GPP TSG RAN WG1 #86,Gothenbourg, Sweden, Aug. 22 26, 2016, R1-166773,total:4pages.
(Continued)

*Primary Examiner* — Linh V Nguyen
(74) *Attorney, Agent, or Firm* — WOMBLE BOND DICKINSON (US) LLP

(57) ABSTRACT

This application provides a channel encoding method and a communication apparatus. A second communication apparatus obtains a first parameter of a first communication apparatus, where the first parameter includes a parameter related to channel coding and decoding and a reinforcement learning training parameter. The second communication apparatus determines, based on the first parameter, first code construction information for constructing a coded bit sequence based on an information bit sequence during channel encoding; and after sending the first code construction information to the first communication apparatus, performs channel encoding and decoding on communication
(Continued)

data between the first communication apparatus and the second communication apparatus by using the first code construction information to improve channel encoding performance and further improve communication reliability.

20 Claims, 8 Drawing Sheets

(58) Field of Classification Search
CPC ...... G06N 3/047; G06N 3/084; H04B 7/0417; H04B 17/24; H04B 17/373; H04B 7/0456; H04B 7/0626; H04L 1/0026; H04L 1/0029; H04L 1/003; H04L 5/0048; H04L 5/0053; H04L 67/566; H04L 67/60; H04L 69/04; H04L 1/0041; H04L 1/0009; H04L 1/0045; H04L 1/0061; H04L 1/189; H04L 25/03165; H04L 41/16; G06F 17/16; G06F 11/1048; G06F 2212/401; G06F 2212/454
USPC ..................................... 341/51, 61, 106, 107
See application file for complete search history.

(56) References Cited

U.S. PATENT DOCUMENTS

| | | |
|---|---|---|
| 2008/0317152 A1 | 12/2008 | Sun et al. |
| 2009/0019333 A1* | 1/2009 | McEvoy ............ H03M 13/1102 714/752 |
| 2019/0215011 A1 | 7/2019 | Nammi et al. |
| 2020/0343985 A1* | 10/2020 | O'Shea .................. G06N 3/047 |
| 2020/0366326 A1* | 11/2020 | Jassal ..................... G06N 3/08 |
| 2021/0084601 A1* | 3/2021 | Rofougaran ........... G06N 3/045 |
| 2021/0266787 A1* | 8/2021 | Yoo ...................... H04B 7/0417 |
| 2021/0344356 A1* | 11/2021 | Berman ............ G11C 16/0483 |
| 2022/0237454 A1* | 7/2022 | Jain ........................ G06N 3/082 |
| 2022/0366008 A1* | 11/2022 | Shin ........................ G06F 9/541 |
| 2023/0231653 A1* | 7/2023 | Shin ................... H03M 13/036 370/252 |
| 2023/0253074 A1* | 8/2023 | Chandak ............ H03M 7/6076 702/19 |
| 2023/0370087 A1* | 11/2023 | Henry .................. H04N 19/136 |

FOREIGN PATENT DOCUMENTS

| | | |
|---|---|---|
| CN | 110890930 A | 3/2020 |
| CN | 111200476 A | 5/2020 |
| WO | 2020035683 A1 | 2/2020 |
| WO | 2020116958 A1 | 6/2020 |

OTHER PUBLICATIONS

R1-1710472 Huawei et al.,"Benefits of implicit soft combining for PBCH by Polar code construction",3GPP TSG RAN WG1 NR Ad-Hoc#2 ,Qingdao, China, Jun. 27 30, 2017,total 6 pages.

* cited by examiner

CHANNEL ENCODING AND DECODING METHOD AND COMMUNICATION APPARATUS

CROSS-REFERENCE TO RELATED APPLICATIONS

This application is a continuation of International Application No. PCT/CN2021/096302, filed on May 27, 2021, which claims priority to Chinese Patent Application No. 202010556048.6, filed on Jun. 17, 2020. The disclosures of the aforementioned applications are hereby incorporated by reference in their entireties.

TECHNICAL FIELD

This application relates to the communication field, and more particularly, to a channel encoding method and a communication apparatus.

BACKGROUND

As the most basic radio access technology, channel encoding is one of important research objects that meet a communication requirement. After the Shannon theory is proposed, persons skilled in the art are devoted to finding an encoding and decoding method that can reach a Shannon limit and that has relatively low complexity. A plurality of channel encoding schemes emerge correspondingly, for example, a convolutional code and a turbo code used in a $3^{rd}$ generation (3G) or $4^{th}$ generation (4G) mobile communication network, and a polar code used for a control channel and a low-density parity-check (LDPC) code used for a data channel in a $5^{th}$ generation (5G) mobile communication system. In a communication system, channel encoding parameters, such as a code block length and a generator matrix, are usually defined in a standardization protocol. In actual communication, channel encoding is performed by using a protocol-defined parameter. However, performance of a protocol-defined channel encoding parameter varies when the parameter is used in different scenarios.

SUMMARY

This application provides a channel encoding and decoding method and a communication apparatus, to improve channel encoding performance, and further improve communication reliability.

According to a first aspect, a communication method is provided. The method may be performed by a first communication apparatus or performed by a module (for example, a chip) configured in (or used in) the first communication apparatus. An example in which the method is performed by the first communication apparatus is used for description below.

The method includes: The first communication apparatus sends a first parameter to a second communication apparatus, where the first parameter includes a parameter related to channel encoding and decoding and a reinforcement learning training parameter. The first communication apparatus obtains first code construction information of the second communication apparatus, where the first code construction information corresponds to the first parameter, and the first code construction information is used to construct a coded bit based on an information bit during channel encoding.

According to the foregoing solution, the first communication apparatus notifies the second communication apparatus of a current scenario parameter used for channel encoding and decoding and a training parameter used to perform reinforcement learning on code construction information, that is, the first parameter, so that the second communication apparatus determines, based on the first parameter, the first code construction information corresponding to the first parameter. Channel encoding and decoding are performed by using the first code construction information corresponding to a scenario used for channel encoding and decoding, so that channel encoding performance can be improved, and further, communication reliability can be improved.

In some embodiments, the first code construction information is a polar channel reliability sorting sequence of a polar code or a base matrix of a low-density parity-check LDPC code.

According to the foregoing solution, channel encoding is performed on communication information between the first communication apparatus and the second communication apparatus by using the polar code or the LDPC code. The first code construction information may be the base matrix of the LDPC code, or the polar channel reliability sorting sequence, of the polar code, that is used to construct a coded bit based on an information bit. The first communication apparatus sends the first parameter to the second communication apparatus and obtains the first code construction information determined by the second communication apparatus based on the first parameter, so that the first communication apparatus and the second communication apparatus can perform channel encoding and decoding by using the first code construction information corresponding to the channel encoding and decoding scenario. This can improve channel encoding performance, and further improve communication reliability.

In some embodiments, the first code construction information is obtained by using a reinforcement learning method.

According to the foregoing solution, the first code construction information obtained by the first communication apparatus is obtained by using the reinforcement learning method, and the second communication apparatus performs, through reinforcement learning based on the first parameter, a process of learning an optimal policy through trial and error (or referred to as exploration), to obtain the first code construction information that better matches the first parameter, to improve channel encoding and decoding performance, and further improve communication reliability.

In some embodiments, before the first communication apparatus obtains the first code construction information, the method further includes: The first communication apparatus obtains exploration code construction information of the second communication apparatus, where the exploration code construction information corresponds to the first parameter. The first communication apparatus assesses performance of the exploration code construction information, generates performance information of the exploration code construction information based on the first parameter, and sends the performance information of the exploration code construction information to the second communication apparatus.

According to the foregoing solution, the first communication apparatus participates in a training process in which the second communication apparatus performs reinforcement learning on code construction information. In some embodiments, the first communication apparatus, as a reinforcement learning environment, assesses the exploration code construction information generated by the second communication apparatus in a reinforcement learning process, and feeds back a reward (namely, the performance information) of the exploration code construction to the second communication apparatus, so that the second communication apparatus can obtain code construction information that corresponds to the first parameter and that has higher performance.

In some embodiments, the method further includes: The first communication apparatus sends capability information to the second communication apparatus, where the capability information is used to indicate whether the first communication apparatus supports an update of code construction information.

According to the foregoing solution, before the exploration code construction information is updated, the two communication entities exchange capability information to reach a consensus on whether they have a capability of updating code construction information, so that code construction information is updated when both entities have a capability of updating code construction information. This improves channel encoding performance, and further improves communication reliability.

In some embodiments, the method further includes: The first communication apparatus performs channel encoding by using the first code construction information after obtaining the first code construction information; or the first communication apparatus performs channel encoding by using the first code construction information after sending acknowledgement information to the second communication apparatus, where the acknowledgement information is used to indicate that the first communication apparatus has obtained the first code construction information.

According to the foregoing solution, the two communication entities reach an agreement on a time point at which channel encoding is to be performed by using the first code construction information, to avoid a case that communication information cannot be correctly received due to use of inconsistent code construction information.

In some embodiments, the channel encoding is channel encoding for one or more of the following communication information: uplink data, downlink data, uplink control information, downlink control information, sidelink data, or sidelink control information.

In some embodiments, the parameter related to channel encoding and decoding includes one or more of the following: channel state information CSI, precoding matrix information PMI, an encoding length, an information bit length, a code rate, and a modulation order.

In some embodiments, the reinforcement learning training parameter includes one or more of the following: a modulation order distribution, an encoding length distribution, a code rate distribution, an information bit length distribution, a codec parameter, a channel feature parameter, or a decoding result.

According to a second aspect, a communication method is provided. The method may be performed by a second communication apparatus or performed by a module (for example, a chip) configured in (or used in) the second communication apparatus. An example in which the method is performed by the second communication apparatus is used for description below.

The method includes: The second communication apparatus obtains a first parameter of a first communication apparatus, where the first parameter includes a parameter related to channel encoding and decoding and a reinforcement learning training parameter. The second communication apparatus determines first code construction information based on the first parameter, where the first code construction information is used to construct a coded bit sequence based on an information bit sequence during channel encoding. The second communication apparatus sends the first code construction information to the first communication apparatus.

According to the foregoing solution, the second communication apparatus obtains a current scenario parameter used by the first communication apparatus for channel encoding and decoding and a training parameter used to perform reinforcement learning on code construction information, that is, the first parameter; and determines, based on the first parameter, the first code construction information corresponding to the first parameter. Channel encoding and decoding are performed by using the first code construction information corresponding to a scenario used for channel encoding and decoding, so that channel encoding performance can be improved, and further, communication reliability can be improved.

In some embodiments, the first code construction information is a polar channel reliability sorting sequence of a polar code or a base matrix of a low-density parity-check LDPC code.

According to the foregoing solution, channel encoding is performed on communication information between the first communication apparatus and the second communication apparatus by using the polar code or the LDPC code. The first code construction information may be the base matrix of the LDPC code, or the polar channel reliability sorting sequence, of the polar code, that is used to construct a coded bit based on an information bit. The first communication apparatus sends the first parameter to the second communication apparatus and obtains the first code construction information determined by the second communication apparatus based on the first parameter, so that the first communication apparatus and the second communication apparatus can perform channel encoding and decoding by using the first code construction information corresponding to the channel encoding and decoding scenario. This can improve channel encoding performance, and further improve communication reliability.

In some embodiments, the first code construction information is obtained by using a reinforcement learning method.

According to the foregoing solution, the second communication apparatus performs, through reinforcement learning based on the first parameter, a process of learning an optimal policy through trial and error (or referred to as exploration), to obtain the first code construction information that better matches the first parameter, so that channel encoding and decoding performance can be improved, and further, communication reliability can be improved.

In some embodiments, the generating first code construction information based on the first parameter includes: generating exploration code construction information based on the first parameter; obtaining performance information of the exploration code construction information; training a code construction information generation model by using the performance information as a reward; and generating the first code construction information by using a trained code construction information generation model.

According to the foregoing solution, the second communication apparatus performs reinforcement learning based on the first parameter to generate the exploration code construction information used for trial and error (or referred to as exploration), obtains a feedback (that is, the performance information) of an environment for the exploration code construction information, and adjusts a reinforcement learning policy by using the performance information as a reward. The first code construction information that better matches the first parameter can be obtained through a plurality of times of exploration, to improve channel encoding performance, and further improve communication reliability.

In some embodiments, the obtaining performance information of the exploration code construction information includes: assessing performance of the exploration code construction information based on the first parameter, and generating the performance information of the exploration code construction information.

According to the foregoing solution, after generating the exploration code construction information, the second communication apparatus assesses the performance of the exploration code construction information, and generates the performance information as a feedback of an environment for the exploration code construction information, where the performance information is used as a reward for adjusting a reinforcement learning policy. The first code construction information that better matches the first parameter can be obtained through a plurality of times of exploration, to improve channel encoding performance, and further improve communication reliability.

In some embodiments, the obtaining performance information of the exploration code construction information includes: sending the exploration code construction information to the first communication apparatus; and obtaining the performance information, determined by the first communication apparatus, of the exploration code construction information.

According to the foregoing solution, the first communication apparatus participates in a training process in which the second communication apparatus performs reinforcement learning on code construction information. In some embodiments, the first communication apparatus, as a reinforcement learning environment, assesses the exploration code construction information generated by the second communication apparatus in a reinforcement learning process, and feeds back a reward (namely, the performance information) of the exploration code construction to the second communication apparatus, so that the second communication apparatus can obtain code construction information that corresponds to the first parameter and that has higher performance.

In some embodiments, in a process of performing reinforcement learning by the second communication apparatus, the second communication apparatus (for example, an assessment unit configured in the second communication apparatus) assesses exploration code construction information generated in a training process, and generates performance information as a reward for adjusting a reinforcement learning policy. When performance of the exploration code construction information reaches a preset value, channel encoding is performed on communication information between the first communication apparatus and the second communication apparatus by using the exploration code construction information. The first communication apparatus assesses the exploration code construction information, and feeds back performance information of the exploration code construction information to the second communication apparatus as a reward, so that the second communication apparatus adjusts the reinforcement learning performance. That is, the first code construction information determined by the second communication apparatus based on the first parameter can still be used as exploration code construction information for reinforcement learning to perform reinforcement learning training in a process of communication between the first communication apparatus and the second communication apparatus. However, this application is not limited thereto.

In some embodiments, the method further includes: The second communication apparatus obtains capability information of the first communication apparatus, where the capability information is used to indicate whether the first communication apparatus supports an update of code construction information.

According to the foregoing solution, before the exploration code construction information is updated, the two communication entities exchange capability information to reach a consensus on whether they have a capability of updating code construction information, so that code construction information is updated when both entities have a capability of updating code construction information. This improves channel encoding performance, and further improves communication reliability.

In some embodiments, the method further includes: The second communication apparatus performs channel encoding and decoding by using the first code construction information after sending the first code construction information to the first communication apparatus; or the second communication apparatus performs channel encoding and decoding by using the first code construction information after obtaining acknowledgement information of the first communication apparatus, where the acknowledgement information is used to indicate that the first communication apparatus has obtained the first code construction information.

According to the foregoing solution, the two communication entities reach an agreement on a time point at which channel encoding is to be performed by using the first code construction information, to avoid a case that communication information cannot be correctly received due to use of inconsistent code construction information.

In some embodiments, the channel encoding is channel encoding for one or more of the following communication information: uplink data, downlink data, uplink control information, downlink control information, sidelink data, or sidelink control information.

In some embodiments, the parameter related to channel encoding and decoding includes one or more of the following: channel state information CSI, precoding matrix information PMI, an encoding length, an information bit length, a code rate, and a modulation order.

In some embodiments, the reinforcement learning training parameter includes one or more of the following: a modulation order distribution, an encoding length distribution, a code rate distribution, an information bit length distribution, a codec parameter, a channel feature parameter, or a decoding result.

According to a third aspect, a method for training a code construction information generation model is provided. The method may be performed by a second communication apparatus or performed by a module (for example, a chip) configured in (or used in) the second communication apparatus. An example in which the method is performed by the second communication apparatus is used for description below.

The method includes: The code construction information is used to construct a coded bit based on an information bit during channel encoding. The method includes: generating exploration code construction information based on a first parameter, where the first parameter includes a parameter value related to channel encoding and decoding and/or a reinforcement learning training parameter value; obtaining performance information of the exploration code construction information; and training a code construction information generation model by using the performance information as a reward.

In some embodiments, the obtaining performance information of the exploration code construction information includes: assessing performance of the exploration code construction information, and generating the performance information based on the parameter value related to channel encoding and decoding.

In some embodiments, the obtaining performance information of the exploration code construction information includes: receiving the performance information from a first communication apparatus.

In some embodiments, the code construction information generation model includes a policy function, and the generating exploration code construction information includes: inputting obtained current-state information of code construction information to the policy function; determining next-state information of the code construction information based on output of the policy function; and generating the exploration code construction information based on the next-state information.

In some embodiments, the policy function is a neural network.

In some embodiments, the method further includes: receiving the first parameter from the first communication apparatus.

In some embodiments, the parameter related to channel encoding and decoding includes one or more of the following: channel state information CSI, precoding matrix information PMI, an encoding length, an information bit length, a code rate, and a modulation order.

In some embodiments, the reinforcement learning training parameter includes one or more of the following: a modulation order distribution, an encoding length distribution, a code rate distribution, an information bit length distribution, a codec parameter, a channel feature parameter, or a decoding result.

In some embodiments, a communication apparatus is provided. The apparatus includes: a processing unit, configured to determine a first parameter, where the first parameter includes a parameter related to channel encoding and decoding and a reinforcement learning training parameter; and a transceiver unit, configured to send the first parameter to a second communication apparatus, where the transceiver unit is further configured to obtain first code construction information of the second communication apparatus, the first code construction information corresponds to the first parameter, and the first code construction information is used to construct a coded bit based on an information bit during channel encoding.

In some embodiments, the first code construction information is a polar channel reliability sorting sequence of a polar code or a base matrix of a low-density parity-check LDPC code.

In some embodiments, the first code construction information is obtained by using a reinforcement learning method.

In some embodiments, before the transceiver unit obtains the first code construction information, the transceiver unit is further configured to obtain exploration code construction information of the second communication apparatus, where the exploration code construction information corresponds to the first parameter; the processing unit is further configured to assess performance of the exploration code construction information, and generate performance information of the exploration code construction information based on the first parameter; and the transceiver unit is further configured to send the performance information of the exploration code construction information to the second communication apparatus.

In some embodiments, the transceiver unit is further configured to send capability information to the second communication apparatus, where the capability information is used to indicate whether an update of code construction information is supported.

In some embodiments, the processing unit performs channel encoding by using the first code construction information after the transceiver unit obtains the first code construction information; or the processing unit performs channel encoding by using the first code construction information after the transceiver unit sends acknowledgement information to the second communication apparatus, where the acknowledgement information is used to indicate that the first code construction information has been obtained.

In some embodiments, the channel encoding is channel encoding for one or more of the following communication information: uplink data, downlink data, uplink control information, downlink control information, sidelink data, or sidelink control information.

In some embodiments, the parameter related to channel encoding and decoding includes one or more of the following: channel state information CSI, precoding matrix information PMI, an encoding length, an information bit length, a code rate, and a modulation order.

In some embodiments, the reinforcement learning training parameter includes one or more of the following: a modulation order distribution, an encoding length distribution, a code rate distribution, an information bit length distribution, a codec parameter, a channel feature parameter, or a decoding result.

According to a fifth aspect, a communication apparatus is provided. The apparatus includes: a transceiver unit, configured to obtain a first parameter of a first communication apparatus, where the first parameter includes a parameter related to channel encoding and decoding and a reinforcement learning training parameter; and a processing unit, configured to determine first code construction information based on the first parameter, where the first code construction information is used to construct a coded bit sequence based on an information bit sequence during channel encoding, and the transceiver unit is further configured to send the first code construction information to the first communication apparatus.

In some embodiments, the first code construction information is a polar channel reliability sorting sequence of a polar code or a base matrix of a low-density parity-check LDPC code.

In some embodiments, the first code construction information is obtained by using a reinforcement learning method.

In some embodiments, the processing unit is further configured to generate exploration code construction information based on the first parameter; the transceiver unit or the processing unit is further configured to obtain performance information of the exploration code construction information; the processing unit is further configured to train a code construction information generation model by using the performance information as a reward; and the processing unit generates the first code construction information by using a trained code construction information generation model.

In some embodiments, that the processing unit is further configured to obtain performance information of the exploration code construction information includes: The processing unit is configured to assess performance of the exploration code construction information, and generate the performance information of the exploration code construction information based on the first parameter.

In some embodiments, that the transceiver unit is further configured to obtain performance information of the exploration code construction information includes: The transceiver unit is configured to obtain the performance information, of the first communication apparatus, of the exploration code construction information.

In some embodiments, the transceiver unit is further configured to obtain capability information of the first communication apparatus, where the capability information is used to indicate whether an update of code construction information is supported.

In some embodiments, the transceiver unit is further configured to perform channel encoding and decoding by using the first code construction information after sending the first code construction information to the first communication apparatus; or the transceiver unit is further configured to perform channel encoding and decoding by using the first code construction information after obtaining acknowledgement information of the first communication apparatus, where the acknowledgement information is used to indicate that the first communication apparatus has obtained the first code construction information.

In some embodiments, the channel encoding is channel encoding for one or more of the following communication information: uplink data, downlink data, uplink control information, downlink control information, sidelink data, or sidelink control information.

In some embodiments, the parameter related to channel encoding and decoding includes one or more of the following: channel state information CSI, precoding matrix information PMI, an encoding length, an information bit length, a code rate, and a modulation order.

In some embodiments, the reinforcement learning training parameter includes one or more of the following: a modulation order distribution, an encoding length distribution, a code rate distribution, an information bit length distribution, a codec parameter, a channel feature parameter, or a decoding result.

According to a sixth aspect, a code construction information generation apparatus is provided. The apparatus includes: a processing module, configured to generate exploration code construction information based on a first parameter, where the first parameter includes a parameter value related to channel encoding and decoding and/or a reinforcement learning training parameter value; an obtaining module, configured to obtain performance information of the exploration code construction information; and a training module, configured to train a code construction information generation model by using related information of a decoding result as a reward, where the processing module is further configured to generate first code construction information by using a trained code construction information generation model.

In some embodiments, the processing unit is further configured to assess performance of the exploration code construction information, and generate the performance information.

In some embodiments, the performance information is obtained by the obtaining module from a first communication apparatus.

In some embodiments, the code construction information generation model includes a policy function, and the processing module is configured to: after inputting obtained current-state information of code construction information to the policy function, determine next-state information of the code construction information based on output of the policy function, and generate the exploration code construction information based on the second state information.

In some embodiments, the policy function is a neural network.

In some embodiments, the transceiver unit is further configured to receive the first parameter from the first communication apparatus.

In some embodiments, the parameter related to channel encoding and decoding includes one or more of the following: channel state information CSI, precoding matrix information PMI, an encoding length, an information bit length, a code rate, and a modulation order.

In some embodiments, the reinforcement learning training parameter includes one or more of the following: a modulation order distribution, an encoding length distribution, a code rate distribution, an information bit length distribution, a codec parameter, a channel feature parameter, or a decoding result.

According to a seventh aspect, a communication apparatus is provided, and includes a processor. The processor is coupled to a memory, and may be configured to execute instructions in the memory, to implement the method in any one of the embodiments discussed in the present disclosure. In some embodiments, the communication apparatus further includes the memory. In some embodiments, the communication apparatus further includes a communication interface, and the processor is coupled to the communication interface.

In some embodiments, the communication apparatus is a terminal device. When the communication apparatus is the terminal device, the communication interface may be a transceiver or an input/output interface.

In some embodiments, the communication apparatus is a chip configured in a terminal device. When the communication apparatus is the chip configured in the terminal device, the communication interface may be an input/output interface.

In some embodiments, the communication apparatus is a network device. When the communication apparatus is the terminal device, the communication interface may be a transceiver or an input/output interface.

In some embodiments, the communication apparatus is a chip configured in a network device. When the communication apparatus is the chip configured in the network device, the communication interface may be an input/output interface.

In some embodiments, the transceiver may be a transceiver circuit. In some embodiments, the input interface and/or the output interface may be an input circuit and/or an output circuit.

In some embodiments, a processor is provided, including an input circuit, an output circuit, and a processing circuit. The processing circuit is configured to receive a signal by using the input circuit, and transmit a signal by using the output circuit, so that the processor performs the method in any one of the embodiments discussed in the present disclosure.

In some embodiments, a chip is provided, including a logic circuit and a communication interface. The communication interface is configured to receive a signal input to the chip, or output a processed signal from the chip. The logic circuit processes the signal input to the chip and generates the processed signal according to the method in any one of the embodiments discussed in the present disclosure.

In some embodiments, the communication interface may be an input interface and/or an output interface, or the communication interface may be an input circuit and/or an output circuit. The input circuit may be an input pin, and the output circuit may be an output pin. An input signal received by the input circuit may be received and input by, for example, but not limited to, a receiver, a signal output by the output circuit may be output to, for example, but not limited to, a transmitter and transmitted by the transmitter, and the input circuit and the output circuit may be a same circuit, where the circuit is used as the input circuit and the output circuit at different moments.

In some embodiments, a processing apparatus is provided, including a processor and a memory. The processor is configured to read instructions stored in the memory, and may receive a signal by using a receiver, and transmit a signal by using a transmitter, to perform the method in any one of the embodiments discussed in the present disclosure.

In some embodiments, there are one or more processors, and there are one or more memories.

In some embodiments, the memory may be integrated with the processor, or the memory and the processor are disposed separately.

In some embodiments, the memory may be a non-transitory memory, for example, a read-only memory (ROM). The memory and the processor may be integrated into a same chip, or may be disposed on different chips. A type of the memory and a manner in which the memory and the processor are disposed are not limited in embodiments of this application.

It should be understood that, a related data exchange process such as sending of indication information may be a process of outputting the indication information from the processor, and receiving of capability information may be a process of receiving the input capability information by the processor. In some embodiments, data output by the processor may be output to a transmitter, and input data received by the processor may be from a receiver. The transmitter and the receiver may be collectively referred to as a transceiver.

The processing apparatus in the tenth aspect may be one or more chips. The processor in the processing apparatus may be implemented by using hardware or software. When the processor is implemented by using hardware, the processor may be a logic circuit, an integrated circuit, or the like. When the processor is implemented by using software, the processor may be a general-purpose processor, and is implemented by reading software code stored in a memory. The memory may be integrated in the processor, or may be located outside the processor and exist independently.

In some embodiments, a computer program product is provided. The computer program product includes a computer program (which may also be referred to as code or instructions). When the computer program is run, the method in any one of the embodiments discussed in the present disclosure is performed.

In some embodiments, a computer-readable storage medium is provided. The computer-readable storage medium stores a computer program (which may also be referred to as code or instructions). When the computer program is run on a computer, the method in any one of the embodiments discussed in the present disclosure is performed.

In some embodiments, a communication system is provided, including at least one first communication apparatus and at least one second communication apparatus in the foregoing descriptions.

DESCRIPTION OF EMBODIMENTS

The following describes technical solutions of this application with reference to the accompanying drawings.

The technical solutions of embodiments of this application may be applied to various communications system, such as a global system for mobile communications (GSM) system, a code division multiple access (CDMA) system, a wideband code division multiple access (WCDMA) system, a general packet radio service (GPRS), a long term evolution (LTE) system, an LTE frequency division duplex (FDD) system, an LTE time division duplex (TDD), a universal mobile telecommunications system (UMTS), a worldwide interoperability for microwave access (WiMAX) communications system, a future 5th generation (5G) system, a new radio (NR) system, vehicle-to-X (V2X), where V2X may include vehicle-to-network (V2N), vehicle to-vehicle (V2V), vehicle-to-infrastructure (V2I), vehicle-to-pedestrian (V2P), or the like, a long term evolution-vehicle (LTE-V) technology, internet of vehicles, machine type communication (MTC), internet of things (IoT), a long term evolution-machine (LTE-M) technology, device-to-device (D2D), machine-to-machine (M2M), or the like.

Figure 1:
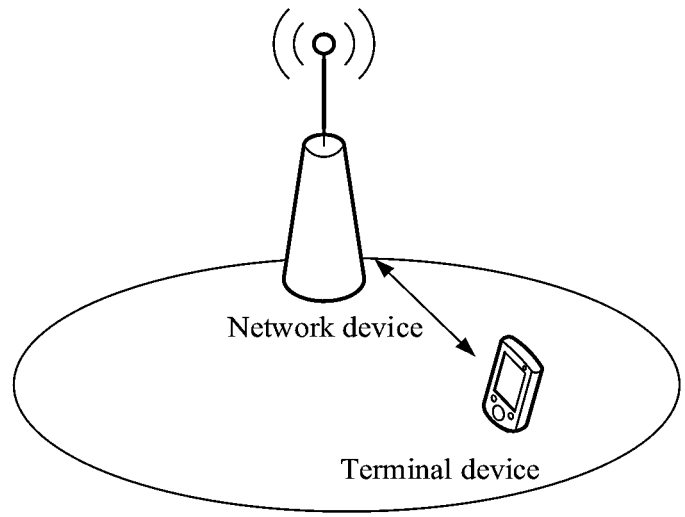
FIG. 1 is a schematic diagram of a wireless communication system to which an embodiment of this application is applicable.

FIG. 1 is a schematic diagram of a wireless communication system 100 to which an embodiment of this application is applicable.

As shown in FIG. 1, the wireless communication system 100 may include at least one network device, for example, a network device 110 shown in FIG. 1. The wireless communication system 100 may further include at least one terminal device, for example, a terminal device 120 shown in FIG. 1. Information bits (for example, control information and data) between the terminal device and the network device and between terminal devices are transmitted after channel encoding. In this application, a first communication apparatus may be the network device in the communication system 100, and a second communication apparatus may be the terminal device in the communication system 100. Alternatively, in this application, a first communication apparatus may be the terminal device in the communication system 100, and a second communication apparatus may be the network device in the communication system 100. Alternatively, in this application, a first communication apparatus and a second communication apparatus may be two terminal devices in the communication system 100.

The terminal device in embodiments of this application may also be referred to as user equipment (UE), an access terminal, a subscriber unit, a subscriber station, a mobile station, a remote station, a remote terminal, a mobile device, a user terminal, a terminal, a wireless communication device, a user agent, or a user apparatus. The terminal device in this embodiment of this application may be a mobile phone, a tablet computer (pad), a computer with a wireless transceiver function, a virtual reality (VR) terminal device, an augmented reality (AR) terminal device, a wireless terminal in industrial control, a wireless terminal in self driving, a wireless terminal in remote medical, a wireless terminal in a smart grid, a wireless terminal in transportation safety, a wireless terminal in a smart city, a wireless terminal in a smart home, a cellular phone, a cordless phone, a session initiation protocol (SIP) phone, a wireless local loop (WLL) station, a personal digital assistant (PDA), a handheld device with a wireless communication function, a computing device or another processing device connected to a wireless modem, a vehicle-mounted device, a wearable device, a terminal device in a 5G network, a terminal device in a future evolved public land mobile network (PLMN), or the like.

The wearable device may also be referred to as a wearable smart device, and is a general term for daily wearable devices that are smartly designed and developed by using wearable technologies, such as glasses, gloves, watches, apparels, and shoes. The wearable device is a portable device that can be directly worn on the body or integrated into clothes or an accessory of a user. The wearable device is not only a hardware device, but also implements a powerful function through software support, data exchange, and cloud interaction. Generalized wearable intelligent devices include full-featured and large-size devices that can implement complete or partial functions without depending on smartphones, such as smart watches or smart glasses, and devices that focus on only one type of application and need to work with other devices such as smartphones, such as various smart bands or smart jewelry for monitoring physical signs.

In addition, the terminal device may be alternatively a terminal device in an internet of things (IoT) system. IoT is an important component of future information technology development. A main technical feature of the IoT is to connect an object to a network by using a communication technology, to implement an intelligent network of human-computer interconnection and thing-to-thing interconnection.

The network device in this embodiment of this application may be any device with a wireless transceiver function. The device includes but is not limited to an evolved NodeB (eNB), a radio network controller (RNC), a NodeB (NB), a base station controller (BSC), a base transceiver station (BTS), a home base station (for example, a home evolved NodeB or a home NodeB, HNB), a baseband unit (BBU), an access point (AP) in a wireless fidelity (Wi-Fi) system, a wireless relay node, a wireless backhaul node, a transmission point (TP), a transmission and reception point (TRP), or the like; or may be a device that plays a function of a network device in satellite communication, V2X, D2D, M2M, and internet of vehicles communication; or may be a gNB or a transmission point (TRP or TP) in a 5G (for example, NR) system, or one antenna panel or a group of antenna panels (including a plurality of antenna panels) of a base station in a 5G system; or may be a network node that constitutes a gNB or a transmission point, for example, a baseband unit (BBU) or a distributed unit (distributed unit, DU).

In some deployment, the gNB may include a central unit (CU) and the DU. The gNB may further include an active antenna unit (AAU). The CU implements some functions of the gNB, and the DU implements some functions of the gNB. For example, the CU is responsible for processing a non-real-time protocol and service, and implementing functions of a radio resource control (RRC) layer and a packet data convergence protocol (PDCP) layer; and the DU is responsible for processing a physical layer protocol and a real-time service, and implementing functions of a radio link control (RLC) layer, a media access control (MAC) layer, and a physical (PHY) layer. The AAU implements some physical layer processing functions, radio frequency processing, and a function related to an active antenna. Information at the RRC layer eventually becomes information at the PHY layer, or is converted from the information at the PHY layer. Therefore, in the architecture, higher layer signaling such as RRC layer signaling or PHCP layer signaling may also be considered as being sent by the DU or sent by the DU and the AAU. It can be understood that the network device may be a device including one or more of a CU node, a DU node, and an AAU node. In addition, the CU may be classified into a network device in an access network (RAN), or the CU may be classified into a network device in a core network (CN). This is not limited in this application.

The network device provides a service for a cell. The terminal device communicates with the cell by using a transmission resource (for example, a frequency domain resource, in other words, a spectrum resource) allocated by the network device. The cell may belong to a macro base station (for example, a macro eNB or a macro gNB), or may belong to a base station corresponding to a small cell. The small cell herein may include a metro cell, a micro cell, a pico cell, a femto cell, and the like. These small cells have features of a small coverage area and a low transmit power, and are suitable for providing high-rate data transmission services.

To better understand solutions of this application, the following describes definitions included in this application.

1. Deep Reinforcement Learning

Deep reinforcement learning is a combination of a deep neural network and reinforcement learning.

The deep neural network is a network with an input layer and an output layer. There is at least one hidden layer between the input layer and the output layer. The hidden layer may be followed by nonlinear activation function processing, for example, a rectified linear unit (ReLU) and tanh. Connection between layers includes interconnection between nodes at the layers. A pair of connected nodes has one weight value and one offset value. The deep neural network may be regarded as nonlinear transformation from input to output. The output may be further input to a loss function to calculate a loss. A gradient resulting from the calculation may be transmitted back from the output layer to the input layer by using a back-propagation (back-propagation) algorithm, to update a weight and an offset of each layer to minimize the loss.

The reinforcement learning is a process in which an agent interacts with an environment and an optimal policy is learned through trial and error (or referred to as exploration). The reinforcement learning can provide solutions for problems with a series of decision-making, especially problems that cannot be theoretically modeled or are difficult to solve. A reinforcement learning system may further include the following concepts: a state (or referred to as an observation), a policy, a reward, a time step, a round, and a value function. The policy determines an action to be taken by the agent in a given state, that is, a mapping from a state to an action.

In the deep reinforcement learning, the state may be input of the deep neural network, and the action corresponds to output of the deep neural network. The reward is a value fed back by the environment after the agent takes an action in the current environment. In each time step, the agent takes an action, and the environment feds back a reward value. Usually, a problem encountered is not a problem that can be solved by optimizing a single action; instead, a series of decision-making needs to be optimized to obtain a final result or a comprehensive result. Therefore, in a process of optimizing a problem through reinforcement learning, a round may be used as a unit, and each round includes a plurality of time steps. The environment may feed back a reward only in a time step in which the round ends. In this case, a reward in a previous time step may be replaced with zero. Certainly, the environment may alternatively feed back a non-zero reward before the round ends. Different environments have different feedback manners. Based on the reward fed back by the environment, an objective of the agent is to maximize a total reward of each round. The value function is also a mapping. Input of the value function may be a state or a combination of a state and an action. Output of the value function is a value. The value indicates an estimated value of the agent for a total reward that may be accumulated in future. A larger value indicates that a currently selected action is better in the long run. In the deep reinforcement learning, the value function may be alternatively represented by a deep neural network. The input of the value function is input of the deep neural network, and the output of the value function is output of the deep neural network.

2. Polar Code

A polar code is a linear block code. A generator matrix is $G_N$. For example, the generator matrix may be denoted as $G_N = B_N F_2^{\otimes(\log_2 N)}$, where N is a code length, $B_N$ is an N×N transposed matrix, for example, a bit reversal transposed matrix, $$F_2 = \begin{bmatrix} 1 & 0 \\ 1 & 1 \end{bmatrix},$$

and $F_2^{\otimes(\log_2 N)}$ is a Kronecker product of $\log_2 N$ matrices $F_2$. An encoding process may be denoted as $x^N = u^N G_N$, where $u^N = (u_1, u_2, \ldots, u_N)$ is a binary row vector. The aforementioned addition and multiplication operations are all addition and multiplication operations in a binary Galois field. It should be noted that, that the generator matrix is obtained by using the bit reversal transposed matrix is only an example, and the generator matrix $G_N$ of the polar code may be alternatively obtained in another manner. For example, the generator matrix may be obtained in a manner in an NR standard protocol of a 5G system (in this manner, no BN exists, or a BN is a unit matrix). This is not limited in this application.

In a polar code encoding process, some bits in $u^N$ are used to carry information and are referred to as information bits, and a sequence number set of positions of the information bits in $u^N$ is denoted as A, and may be referred to as a position sequence number set; and other bits in $u^N$ are set to fixed values pre-agreed upon by a transmit end and a receive and are referred to as fixed bits, and an index set of the other bits is represented by a complementary set $A^c$ of A. The sequence number set A of the information bits may be determined by using the following method: An error probability P of a polar channel corresponding to each of N position sequence numbers is obtained by using a method such as density evolution or Gaussian approximation, and K sequence numbers corresponding to K polar channels with smallest values of error probabilities P are selected from the N position sequence numbers to constitute the position sequence number set of the information bits. Alternatively, reliability sorting is performed on position sequence numbers of polar channels in descending order of error probabilities P of the channels based on the error probabilities P of the polar channels, to obtain a reliability sorting sequence. In this application, the reliability sorting sequence may be referred to as code construction information of the polar code.

The most basic decoding method for the polar code is a successive cancellation (SC) decoding algorithm. However, decoding performance of the algorithm is not ideal in the case of a limited code length. A subsequently proposed cyclic redundancy check aided-successive cancellation list (CA-SCL) decoding algorithm improves decoding performance for a short code through horizontal path extension and CRC check selection.

3. Low-Density Parity-Check (LDPC) Code

There are two manners of constructing an LDPC code. One is based on computer searches, for example, a Gallager code, a MacKay code, or a PEG codes. The other is based on an algebraic tool, for example, a finite geometric code. An advantage of the computer search manner is that the computer search manner is simple and an LDPC code with any code length and any code rate can be flexibly constructed. However, the computer search method usually focuses on local optimization of a code and lacks global optimization, and therefore has poor global performance. Comparatively, the algebraic tool can ensure a better global structure of an LDPC code, but cannot flexibly deal with different code parameters. A base matrix of an LDPC code is a sparse m×n-dimensional parity-check matrix H with a plurality of 0s and 1s. From a perspective of a Tanner graph, m rows of the H matrix correspond to m check nodes, and n columns correspond to n variable nodes. In this application, the base matrix of the LDPC code may be referred to as code construction information of the LDPC code It should be noted that the polar code and the LDPC code are used as examples for description in this application. However, this application is not limited thereto, and another channel encoding scheme, for example, a channel encoding scheme used in a future communication system, may be alternatively used. Any variation or replacement readily figured out by persons skilled in the art within the technical scope disclosed in this application shall fall within the protection scope of this application.

In a communication system, code construction information for channel encoding, such as a construction sequence and a generator matrix, are usually defined in a standardization protocol. In actual communication, channel encoding is performed by using the code construction information defined in the protocol. However, performance varies when the channel encoding parameters defined in the protocol are used in different scenarios. For example, in a 5G communication system, a polar code is used as a channel encoding scheme for a control channel, and a nested sequence with a length of 1024 is defined as code construction information of the polar code in a protocol, where the code construction information of the polar code may also be referred to as a reliability sorting sequence of polar channels. In actual communication, polar channels corresponding to K position sequence numbers with highest reliability in the reliability sorting sequence may be selected based on a length K of information bits to transmit the information bits. For another example, a 5G standard specifies two base matrices of LDPC codes as code construction information of the LDPC codes, where the two base matrices respectively correspond to a short code with a low code rate and a long code with a high code rate. However, it is found in practice that channel encoding performance varies when a parameter related to channel encoding varies, for example, when an information bit length, an encoding length, a quantity of LDPC decoding iterations, or a polar decoder list size varies. As a result, this method in which fixed code construction is used cannot meet a future mobile communication system with a higher reliability requirement. This application proposes a method for generating code construction information online, to improve channel encoding performance, and further improve communication reliability.

Figure 2:
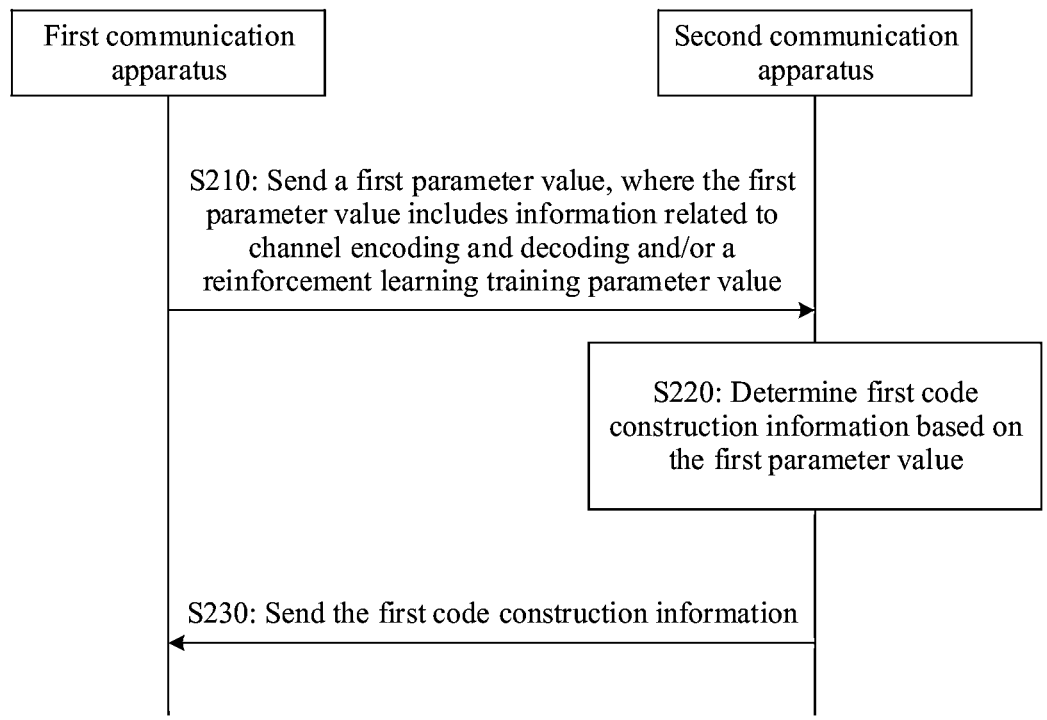
FIG. 2 is an example schematic flowchart of a channel encoding and decoding method according to an embodiment of this application.

FIG. 2 is an example flowchart of a channel encoding and decoding method according to an embodiment of this application.

It should be noted that, in the embodiment of FIG. 2, a first communication apparatus may be configured in a network device, or the first communication apparatus is a network device; and a second communication apparatus may be configured in a terminal device, or the second communication apparatus is a terminal device. Alternatively, the first communication apparatus may be configured in a terminal device, or the first communication apparatus is a terminal device; and the second communication apparatus may be configured in a network device, or the second communication apparatus is a network device. Alternatively, the first communication apparatus and the second communication apparatus are configured in different terminal devices, or the first communication apparatus and the second communication apparatus are different terminal devices.

S210: The first communication apparatus sends a first parameter to the second communication apparatus, where the first parameter includes a parameter related to channel encoding and decoding and/or a reinforcement learning training parameter.

Correspondingly, the second communication apparatus receives the first parameter from the first communication apparatus.

As an example rather than a limitation, the parameter related to channel encoding and decoding may include but is not limited to one or more of the following parameters:

an encoding length, an information bit length, a code rate, a modulation order, or a MIMO-related parameter.

The MIMO-related parameter may include an antenna configuration, channel state information CSI, precoding matrix information PMI, and the like.

As an example rather than a limitation, the reinforcement learning training parameter may include but is not limited to one or more of the following parameters:

a modulation order distribution, an encoding length distribution, a code rate distribution, an information bit length distribution, a codec parameter, a channel feature parameter, or a decoding result.

The codec parameter may include a decoder list size, a decoder list size distribution, a quantity of iterations of a decoder, a distribution of a quantity of iterations of a decoder, and the like. The channel feature parameter may include a signal-to-noise ratio, a signal-to-noise ratio distribution, channel strength, a channel strength distribution, multipath information, a multipath delay spread distribution, frequency selectivity information, a frequency selectivity fading distribution, and the like on one or more antennas. The decoding result may include a signal-to-noise ratio, hybrid automatic repeat request (HARQ) information (for example, an ACK or a NACK), a bit error ratio (BER), a block error rate (BLER), and the like that reach a performance index.

The distribution of each parameter may be a description of a quantity of times or frequency of using the parameter by the first communication apparatus within a period of time. For example, the first communication apparatus learns, through statistics, that encoding and decoding are performed for a total of 1000 times in the last 24 hours, where decoding is performed for 800 times by using a polar code decoder with a list size of 8 (list 8), and decoding is performed for 200 times by using a polar code decoder with a list size of 2 (list 2). In this case, the decoder list size list distribution may be described in a manner in which the list 2 corresponds to frequency of 20% and the list 8 corresponds to frequency of 80%.

That is, the first communication apparatus sends, to the second communication apparatus, a current application scenario parameter related to channel encoding and decoding, so that the second communication apparatus generates, based on an application scenario of the first communication apparatus, code construction information that is applicable to the application scenario and that has good performance.

As an example rather than a limitation, the code construction information is used to construct a coded bit sequence based on an information bit sequence during channel encoding, or the code construction information is used to obtain an information bit sequence based on a coded bit sequence during channel decoding (in other words, channel decoding). For example, the code construction information may be a polar channel reliability sorting sequence of a polar code or a base matrix of an LDPC code.

S220: The second communication apparatus determines first code construction information based on the first parameter.

In some embodiments, after receiving the first parameter, the second communication apparatus performs simulation and the like based on the first parameter, to generate the first code construction information corresponding to the first parameter, generates code construction information, for channel encoding, that is applicable to an application scenario corresponding to the first parameter.

In some embodiments, the second communication apparatus determines the first code construction information based on the first parameter and a first mapping relationship. The first mapping relationship is a mapping relationship between the first parameter and code construction information, and one piece of code construction information may be uniquely determined based on the received first parameter.

In some embodiments, the second communication apparatus determines the first code construction information based on the first parameter by using a reinforcement learning method.

In some embodiments, the second communication apparatus generates exploration code construction information based on the first parameter, obtains performance information of the exploration code construction information, trains a code construction information generation model by using the performance information of the exploration code construction as a reward, and generates the first code construction information by using a trained code construction information generation model.

According to the foregoing solution, the second communication apparatus obtains a current scenario parameter used by the first communication apparatus for channel encoding and decoding and a training parameter used to perform reinforcement learning on code construction information, that is, the first parameter; and determines, based on the first parameter, the first code construction information corresponding to the first parameter. Channel encoding and decoding are performed by using the first code construction information corresponding to a scenario used for channel encoding and decoding, so that channel encoding performance can be improved, and further, communication reliability can be improved.

Figure 3:
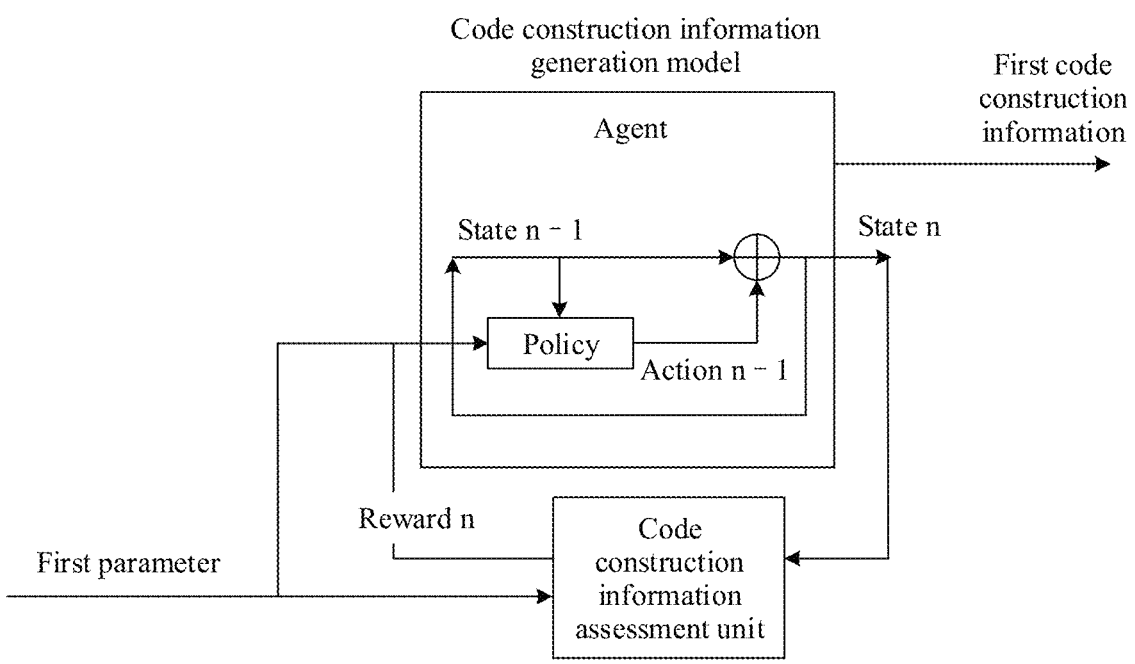
FIG. 3 is an example schematic diagram of performing reinforcement learning training on a code construction information generation model according to an embodiment of this application.

FIG. 3 is an example schematic diagram of performing reinforcement learning training on a code construction information generation model according to an embodiment of this application.

For example, the first communication apparatus and the second communication apparatus perform channel encoding and decoding by using a polar code. The first communication apparatus receives the first parameter from the second communication apparatus. For example, the first parameter includes a code length L (that is, an example of a parameter related to channel encoding) and a decoder list size S (that is, an example of a parameter related to reinforcement learning). In this case, a state of reinforcement learning is a bit string (or a bit vector or a bit sequence) with a length of L, each bit of the bit string represents a polar channel, and a bit sequence number is a sequence number of a polar channel. A value of each bit is 0 or 1. If a bit is set to "0", it indicates that a polar channel represented by the bit is not selected. If a bit is set to "1", it indicates that a polar channel represented by the bit is selected. At the beginning of a round, a state is all 0s. The state is input to an agent, and the agent outputs an action according to a policy and based on the input state. The action is an integer value ranging from 1 to L, that is, a sequence number of a polar channel selected by the agent according to the policy. There are a plurality of methods for selecting an action. This is related to a policy design. The action causes a change of the state. In some embodiments, in a bit string of the state, a bit corresponding to a polar channel selected by the action changes from "0" to "1" (it should be noted that, during action selection, selection of an action corresponding to a state that is already 1, that is, the state has been selected in a previous time step, should be avoided).

In some embodiments, the policy may be a deep neural network, that is, the state is input of the neural network. The neural network outputs a vector with a length of L based on the state, where a position with a largest value in the vector is used as an action. To avoid selecting an action corresponding to a state that is already 1, a mask may be added to the output of the neural network. For example, output of the neural network that corresponds to a position whose state is already 1 is forcibly set to be the smallest. Because the largest value in the vector is used as an action, selection of a selected position can be avoided. When the policy of the agent in the reinforcement learning is used as a deep neural network, the reinforcement learning may be referred to as deep reinforcement learning.

Selecting an action based on the output of the neural network may be referred to as sampling. As described in the foregoing example, the sampling may be selecting a position with a largest value in the output, or may be using an output value as a probability of selection, or may be making some transformation on an output value, for example, softmax, and then selecting an action based on a transformation result. The action may be a position corresponding to an output, or may be an operation to which a position is mapped. In the foregoing example, the action is a position, and also represents a sequence number of a polar channel. In other embodiments, the action may be alternatively another operation of changing a channel encoding construction. For example, a position 1 is selected based on the output of the neural network, and in an action mapping table, an action to which the position 1 is mapped is to flip a non-1 polar channel that currently has highest reliability, and an action to which a position 2 is mapped is to flip a non-0 polar channel that currently has lowest reliability. It can be learned that the action may be any operation capable of changing a current channel encoding construction. In addition, there may be a plurality of agents and code construction information assessment units in a device, and the agents explore a code construction in parallel and interact with corresponding code construction information assessment units to obtain rewards. Output of the plurality of agents and corresponding rewards are placed together for training, so that a training direction of the agent can be more reliable.

A state changed due to an action may be understood as that one more bit is selected from a mother code sequence. Correspondingly, a quantity of information bits (or referred to as an information bit length) is also increased by 1 compared with that before, that is, a current state corresponds to a construction under one quantity of information bits, and also corresponds to decoding performance under the quantity of information bits, where the decoding performance is obtained by the code construction information assessment unit by using a code length L and a list size S. That is, the changed state corresponds to one piece of exploration code construction information. The agent obtains performance information corresponding to the exploration code construction information, that is, obtains a feedback (namely, a reward) of an environment for the action. In this case, one time step ends. After a round undergoes a maximum of L time steps, the round ends.

As an example rather than a limitation, the performance information may include but is not limited to a signal-to-noise ratio, a signal to interference plus noise ratio, a bit error ratio (BER) and/or a block error rate (BLER), a HARQ feedback, or the like, of a decoding result corresponding to the exploration code construction information, that reaches a performance index.

After the round ends, a total reward is a sum of rewards of all time steps, that is, a sum of decoding performance corresponding to construction information of all information bit lengths under the code length L. In a plurality of rounds of training of the reinforcement learning, an objective of the agent is to maximize a total reward of each round (herein, the maximizing the reward means maximizing performance). After a period of time of training, when a change of a sum of performance information of a round compared with a sum of performance information of a previous round is less than or equal to a preset threshold, or when a difference between actions of exploration in the deep reinforcement learning becomes increasingly small and an entropy of an output action is less than or equal to a preset threshold, it can be considered that the exploration of the reinforcement learning converges. In this case, the training is stopped. Alternatively, a quantity of rounds is specified, and the training is stopped when the training reaches a predetermined maximum quantity of rounds. After the training is stopped, a round with highest performance is selected, an action of each time step in the round is recorded, and the actions constitute a sequence with a length of L in order. The sequence is a first code construction sequence, namely, the polar channel reliability sorting sequence of the polar code, or referred to as a nested construction sequence of a polar code.

For another example, the first communication apparatus and the second communication apparatus perform channel encoding and decoding by using an LDPC code. The first communication apparatus receives the first parameter from the second communication apparatus. For example, the first parameter includes a code length L, an information bit length K, and a quantity X of iterations. Similar to the polar code construction optimization in the foregoing example, a state may be an m×n LDPC base matrix. When a dimensionality of the state is greater than 1, a convolutional neural network (CNN) may be used as a deep neural network. In addition, a starting value of the state is all 0s, a value is selected in 1 to m×n for each action, and a state value corresponding to the state is set to "1". When a round ends, an agent obtains performance information corresponding to exploration code construction information (that is, a base matrix obtained in the round). Alternatively, each time the state changes, the agent obtains performance information corresponding to exploration code construction information in the state. The decoding performance is obtained by a code construction information assessment unit by using the code length L, the information bit length K, and the quantity X of iterations. After a plurality of rounds of training, the first code construction information, that is, an LDPC base matrix corresponding to the first parameter obtained from the first device, is determined.

Performance of the exploration code construction information may be assessed by the code construction information assessment unit to obtain the performance information. That is, the code construction information assessment unit may serve as a reinforcement learning environment, and feed back the performance information of the exploration code construction information feedback to the agent as a reward. Because a plurality of channel codes may be used in a communication system, the assessment unit may also assess code construction information of a plurality of channel codes and return their comprehensive performance as a reward. The code construction information assessment unit may be configured in the second communication apparatus. When the code construction information assessment unit is configured in the second communication apparatus, the code construction information assessment unit may be referred to as an internal environment. Alternatively, the code construction information generation model may be configured in an external device other than the second communication apparatus. When the code construction information assessment unit is configured in an external device, the code construction information assessment unit may be referred to as an external environment.

In some embodiments, the code construction information assessment unit is configured in the second communication apparatus.

Figure 4:
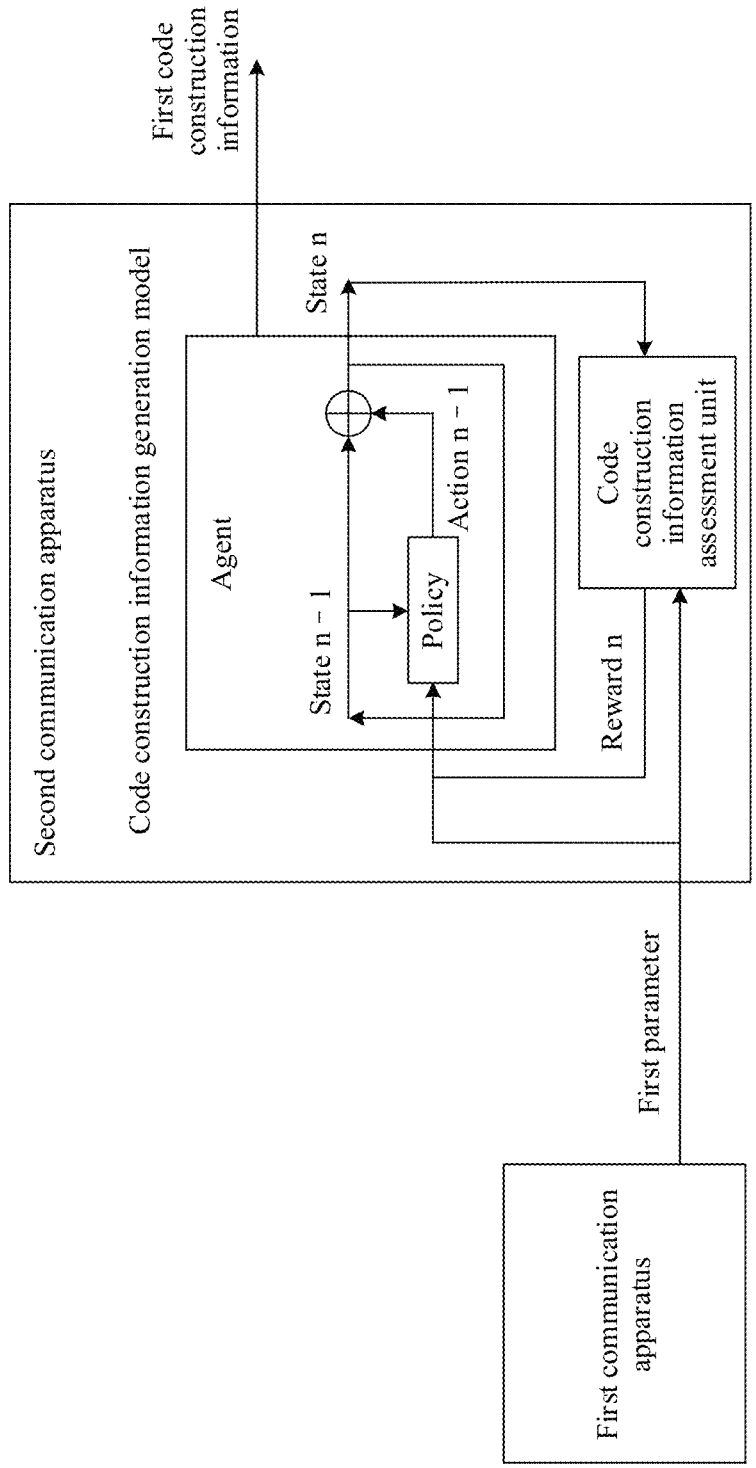
FIG. 4 is another example schematic diagram of performing reinforcement learning training on a code construction information generation model according to an embodiment of this application.

For example, as shown in FIG. 4, after an agent outputs a state changed due to an action (the state corresponds to one piece of exploration code construction information), the state is input to the code construction information assessment unit, or the exploration code construction information corresponding to the changed state is input to the code construction information assessment unit. The code construction information assessment unit assesses performance of the exploration code construction information based on the first parameter, and outputs performance information of the exploration code construction information.

In some embodiments, the code construction assessment unit is configured in an external device other than the second communication apparatus.

After sending the exploration code construction information to the external device, the second communication apparatus obtains performance information, determined by the external device, of the exploration code construction information.

Figure 5:
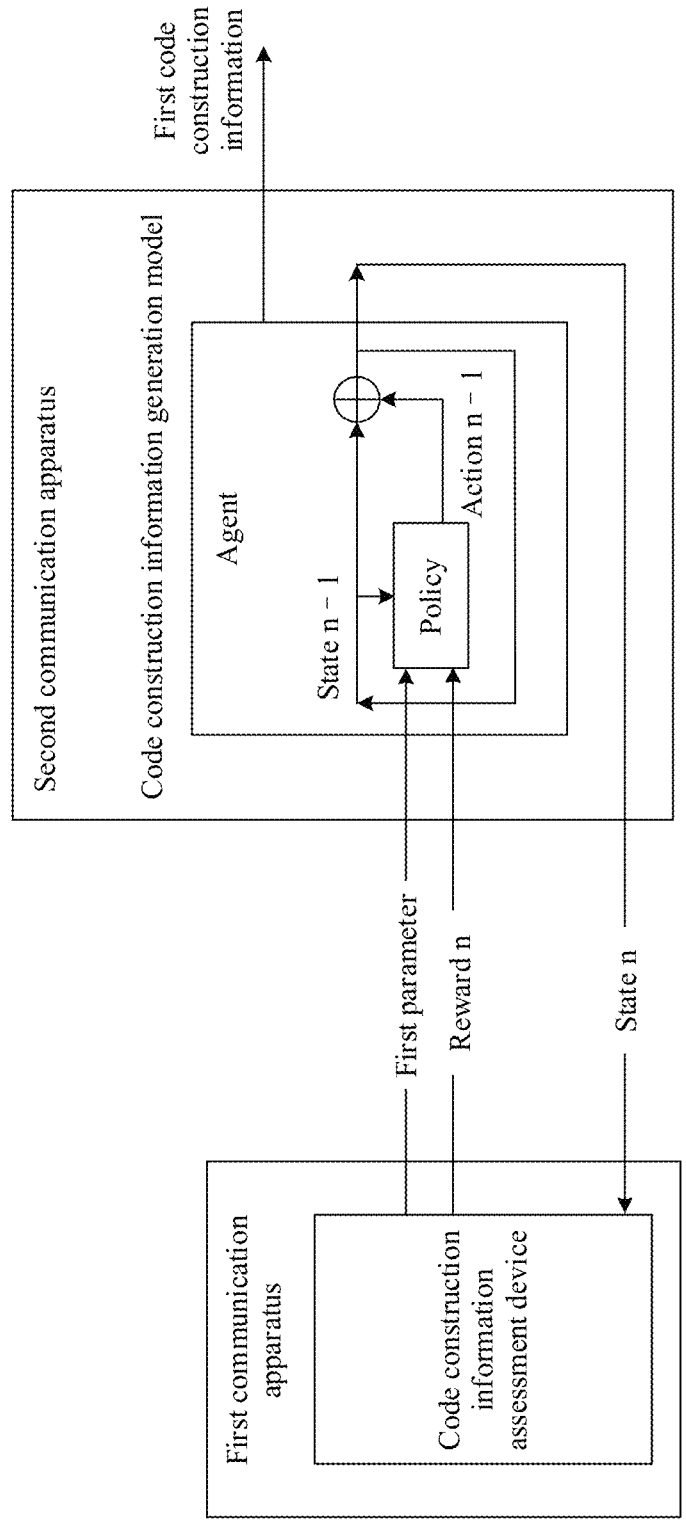
FIG. 5 is another example schematic diagram of performing reinforcement learning training on a code construction information generation model according to an embodiment of this application.

For example, as shown in FIG. 5, the external device may be the first communication apparatus, and the code construction assessment unit is configured in the first communication apparatus. After an agent of the second communication apparatus outputs a state, the state or exploration code construction information corresponding to the state is sent to the first communication apparatus. The second communication apparatus may assess performance of the exploration code construction information based on the first parameter, determine performance information of the exploration code construction information, and then send the performance information of the exploration code construction information to the second communication apparatus.

In some embodiments, the code construction information generation model has both an internal environment and an external environment. That is, the foregoing embodiments may be implemented in combination.

For example, the second communication apparatus trains the code construction information generation model based on the first parameter through interaction between an agent and an internal code construction information assessment unit to generate the first code construction information. A time point at which the first code construction information is generated may be controlled by some preset parameters. For example, the first code construction information is generated when a reward reaches a preset threshold. The time point is a time point at which an environment interacting with the agent changes from the internal environment to the external environment. The first communication apparatus and the second communication apparatus perform channel encoding and decoding by using the first code construction information in a communication process. A code construction information assessment unit configured in the first communication apparatus may assess performance of the first code construction information, and transmit performance information of the first code construction information to the second communication apparatus. The second communication apparatus trains the code construction generation model based on the performance information, obtained from the first communication apparatus, of the first construction information. That is, code construction information used in a communication process may also be used as exploration code construction information to participate in training of the code construction generation model, to obtain optimal code construction information corresponding to the first parameter.

The code construction information generation model may be a pre-trained model. In some embodiments, one or more training models corresponding to values of different first parameters, and when a same or similar first parameter is received, a corresponding training model (for example, which may be referred to as a pre-trained model) is invoked to initialize a policy network of an agent. This can prevent the agent from starting training from completely random sampling, and can reduce a training time. The pre-trained model may be generated by the second communication apparatus (for example, generated by the second communication apparatus through training), or may be obtained from another device.

In some embodiments, the code construction information assessment unit may include a channel codec, and may alternatively assess performance of input exploration code construction information by using a theoretical calculation formula, a table lookup method, or a combination of the foregoing methods.

For example, the code construction information assessment unit includes a channel codec, and performs Monte Carlo simulation based on input exploration code construction information to obtain performance information of the exploration code construction information. In some embodiments, the code construction information assessment unit may further include a channel simulator. When the first parameter includes a parameter of a channel feature, the channel simulator may simulate a channel corresponding to the channel feature, and assess performance of input exploration code construction information in combination with the codec. However, this application is not limited thereto.

For another example, theoretical calculation may be first performed on exploration code construction information input to the code construction information assessment unit, and when the exploration code construction information violates a known reliable channel encoding rule, the code construction information assessment unit may output a reward of the exploration code construction information without performing assessment by using a Monte Carlo simulation method, for example, may output a negative reward. This can reduce a time consumed by a large amount of inappropriate exploration, and improve efficiency of reinforcement learning. However, this application is not limited thereto.

For another example, assessment experience may be shared among a plurality of communication apparatuses. For example, the plurality of communication apparatuses are a plurality of network devices, and an assessment result of code construction information is shared among the plurality of network devices. When exploration code construction information is input to the code construction information assessment unit, the code construction information assessment unit may query the shared assessment result. When the shared assessment result includes an assessment result of code construction information whose similarity with the input exploration code construction information and/or the first parameter reaches a preset value, the assessment result may be directly output as a reward of the input exploration code construction information. Likewise, this can reduce a time of Monte Carlo simulation, and improve efficiency of reinforcement learning. However, this application is not limited thereto.

For another example, the code construction assessment unit may further collect statistics on performance (for example, a BER or a BLER) of code construction information (which may be first code construction information previously output by the agent or code construction information specified in a protocol) used by the first communication apparatus and the second communication apparatus, generate performance information, and feed back the performance information to the agent as a reward. The agent outputs new first code construction information after performing training.

In some embodiments, the code construction information assessment unit generates a reward of exploration code construction information by using a reinforcement learning training parameter. The reinforcement learning training parameter may be obtained by the first communication apparatus through statistics collection. When the code construction information assessment unit is configured in the second communication apparatus, the reinforcement learning training parameter may be included in the first parameter and sent to the second communication apparatus. Alternatively, the reinforcement learning training parameter may be obtained by the second communication apparatus through statistics collection. When the code construction information assessment unit is configured in the second communication apparatus, the reinforcement learning training parameter may be sent by the second communication apparatus to the first communication apparatus.

For example, the reinforcement learning training parameter includes a decoder list size distribution. For example, the first communication apparatus has decoders with two list sizes. For example, the list sizes are 2 and 8. The first communication apparatus invokes a decoder with a list size of 2 at a probability p, and schedules a decoder with a length of 8 at a probability 1−p. In this case, after obtaining the performance information of the exploration code construction information, the code construction information assessment unit may calculate a reward value by using the following formula:

Reward value=$w$×(performance information with a list size of 2)+(1−$w$)×(performance information with a list size of 8), where $w$=p; or when p is greater than or equal to a preset threshold, $w$=1; or when p is less than the preset threshold, $w$=0.

Performance of first code construction information obtained through training in this manner is higher when a list size with a high invocation probability is used. That is, when channel encoding and decoding is performed by using the first code construction information obtained in the foregoing manner, channel encoding and decoding performance achieved through decoding by using a decoder corresponding to a list size with a higher invocation probability is better than channel encoding and decoding performance achieved through decoding by using a decoder corresponding to a list size with a lower invocation probability.

For another example, the reinforcement learning training parameter includes a code length distribution, and the first parameter sent by the first communication apparatus to the second communication apparatus includes the code length distribution. For example, the first communication apparatus performs channel encoding by using a code length of 256 at a probability p, and performs channel encoding by using another code length at a probability 1−p. In this case, after obtaining the performance information of the exploration code construction information, the code construction information assessment unit may calculate a reward value by using the following formula:

Reward value=w×(performance information with a code length of 256)+(1−w)×(performance information with another code length), where w=p; or when p is greater than or equal to a preset threshold, w=1; or when p is less than the preset threshold, w=0.

Performance of first code construction information obtained through training in this manner is higher when a code length with a high use probability is used.

It should be noted that code construction information corresponding to the code length of 256 and code construction information corresponding to the other code length may be obtained by using an extraction or extension method based on current exploration code construction information. In some embodiments, based on code construction information corresponding to a code length of L, code construction information with a code length less than L may be obtained by using an extraction method, or code construction information with a code length greater than L may be obtained by using an extension method. For example, after a polar channel reliability sorting sequence with a code length of 1024 is obtained, in this case, a value range of the sequence is 0 to 1023. To extract a reliability sequence with a code length of 512 from the sequence, all values less than 512 in the sequence need to be retained, and an order of the values in the sequence with a length of 1024 needs to be maintained to constitute a sequence with a length of 512, that is, an extracted construction sequence with a length of 512. For another example, after a reliability sequence with a code length of 1024 is obtained, to obtain a reliability sequence with a length of 2048, an extension method such as a polarization weight (PW) or a FRANK (FRActally eNhanced Kernel) may be used.

For another example, the reinforcement learning training parameter sent by the first communication apparatus to the second communication apparatus includes an information bit length distribution. For example, a probability that the first communication apparatus performs channel encoding by using an information bit length of k is pk, where k is a positive integer. In this case, after obtaining the performance information of the exploration code construction information, the code construction information assessment unit may calculate a reward value by using the following formula:

Reward value=SUM(wk×performance information with the information bit length of k), where w=p; or when p is greater than or equal to a preset threshold, w=1; or when p is less than the preset threshold, w=0.

Performance of first code construction information obtained through training in this manner is higher when an information bit length with a high use probability is used.

For another example, the reinforcement learning training parameter may be a channel feature distribution or a scenario distribution. For example, a scenario includes a decoder list size L and an information bit length N. A reward value is calculated based on a probability of using a scenario (that is, a value of L, N, and the like) and a probability of using another scenario (that is, another value of L, N, and the like). For brevity, details are not described herein.

S230: The second communication apparatus sends the first code construction information to the first communication apparatus.

Correspondingly, the first communication apparatus obtains the first code construction information determined by the second communication apparatus.

In some embodiments, the second communication apparatus directly sends the first code construction information; or the second communication apparatus compresses the first code construction information in a preset compression manner and then sends compressed first code construction information, and after obtaining the compressed first code construction information, the first communication apparatus decompresses the compressed first code construction information in the preset compression manner to obtain the first code construction information.

In some embodiments, each time the second communication apparatus performs reinforcement learning and generates first construction information, the second communication apparatus stores the first parameter and corresponding first construction information. The correspondence may be the foregoing first mapping relationship. The second communication apparatus may store first construction information that corresponds to the first parameter and that is sent by a plurality of communication apparatuses that have performed communication with the second communication apparatus. After the second communication apparatus obtains the first parameter of the first communication apparatus, the second communication apparatus may determine, based on the first mapping relationship, whether first code construction information corresponding to the first parameter of the first communication apparatus is stored; or may use, as first code construction information corresponding to the first parameter of the first communication apparatus, first code construction information that is stored in the first mapping relationship, that corresponds to the first parameter, and whose similarity to the first parameter of the first communication apparatus is greater than or equal to a threshold value, and send the first code construction information to the first communication apparatus. The first mapping relationship may be shown in the following Table 1. However, this application is not limited thereto.

TABLE 1

| First parameter A | First code construction information A |
| First parameter B | First code construction information B |
| ... | ... |
| First parameter X | First code construction information X |

In some embodiments, the first communication apparatus and the second communication apparatus prestore a plurality of pieces of candidate first code construction information and corresponding identifiers. After determining code construction information that corresponds to the first parameter of the first communication apparatus and that has good performance (for example, determining code construction information corresponding to the first parameter through simulation or a reinforcement learning), the second communication apparatus performs matching against the plurality of pieces of prestored candidate first code construction information; determines, from the plurality of pieces of prestored candidate first code construction information, one piece of candidate first code construction information with a highest similarity to code construction information corresponding to the first parameter as first code construction information; and sends an identifier of the determined first code construction information to the first communication apparatus. The first communication apparatus determines, based on the received identifier, that candidate first code construction information corresponding to the identifier is the first code construction information.

In some embodiments, the plurality of pieces of prestored candidate first code construction information and the corresponding identifiers may be specified in a protocol.

In some embodiments, the plurality of pieces of prestored candidate first code construction information and the corresponding identifiers may be code construction information that is updated each time and that is stored after the first communication apparatus and the second communication apparatus update code construction information for a plurality of times. In addition, the first communication apparatus and the second communication apparatus have reached a consensus on an identifier of each piece of stored candidate code construction information. For example, an identifier of code construction information obtained through a first update is "1", and an identifier of code construction information obtained through a second update is "2". However, this application is not limited thereto.

The first communication apparatus and the second communication apparatus need to reach an agreement on a moment at which channel encoding and decoding are to be performed by using the first code construction information, to avoid a communication failure due to use of inconsistent code construction information In some embodiments, after sending the first code construction information, the second communication apparatus performs channel encoding and decoding on communication information (for example, data or signaling) between the first communication apparatus and the second communication apparatus by using the first code construction information. Correspondingly, after receiving the first code construction information, the first communication apparatus performs channel encoding and decoding on communication information between the first communication apparatus and the second communication apparatus by using the first code construction information. For example, a starting moment at which channel encoding and decoding are performed by using the first code construction information may be a starting moment of a next symbol, a slot, or a subframe of a symbol that carries the code construction information. However, this application is not limited thereto.

In some embodiments, after sending acknowledgement information, the first communication apparatus performs channel encoding and decoding on communication information between the first communication apparatus and the second communication apparatus by using the first code construction information. The acknowledgement information is used to indicate that the first communication apparatus has obtained the first code construction information. Correspondingly, after receiving the acknowledgement information, the second communication apparatus performs channel encoding and decoding on communication information between the first communication apparatus and the second communication apparatus by using the first code construction information. For example, a starting moment at which channel encoding and decoding are performed by using the first code construction information may be a starting moment of a next symbol, a slot, or a subframe of a symbol that carries the acknowledgement information. However, this application is not limited thereto.

For example, the second communication apparatus may be a network device, and the first communication apparatus is a terminal device. After determining the first code construction information corresponding to the first parameter, the network device configures, for the terminal device by using a radio resource control (RRC) reconfiguration message, the first code construction information used for channel encoding and decoding. After the reconfiguration message takes effect, the network device and the terminal device perform channel encoding and decoding on communication information between the network device and the terminal device by using the first code construction information. However, this application is not limited thereto.

As an example rather than a limitation, the first code construction information is used for channel encoding and decoding for one or more of the following communication information:

uplink data, downlink data, uplink control information, downlink control information, sidelink data, or sidelink control information.

According to the foregoing solution, the first communication apparatus notifies the second communication apparatus of a current scenario parameter used for channel encoding and decoding and a training parameter used to perform reinforcement learning on code construction information, that is, the first parameter, so that the second communication apparatus determines, based on the first parameter, the first code construction information corresponding to the first parameter. In some embodiments, the second communication apparatus may determine the first code construction information by using a reinforcement learning method or a deep reinforcement learning method. Channel encoding and decoding are performed by using the first code construction information corresponding to a scenario used for channel encoding and decoding, so that channel encoding performance can be improved, and further, communication reliability can be improved.

This embodiment of this application further provides the following polar channel reliability sorting sequences, of polar codes, that are obtained through reinforcement learning and that correspond to different combinations of code lengths and decoder list sizes.

When a code length is 1024 and a decoder list size is 8, a sequence of polar channel reliability sorted in ascending order is as follows:

[2, 4, 1, 8, 0, 16, 32, 6, 9, 64, 10, 17, 12, 128, 18, 33, 5, 20, 34, 256, 3, 65, 24, 36, 66, 14, 40, 129, 19, 68, 48, 13, 512, 130, 22, 72, 25, 257, 35, 132, 21, 80, 37, 258, 26, 136, 42, 96, 11, 513, 67, 28, 144, 38, 260, 49, 69, 264, 41, 74, 160, 7, 514, 52, 131, 81, 44, 272, 70, 27, 192, 133, 50, 88, 516, 76, 15, 138, 288, 56, 98, 39, 520, 134, 73, 259, 145, 30, 84, 320, 45, 140, 262, 97, 528, 82, 51, 162, 265, 23, 148, 104, 46, 544, 71, 137, 261, 384, 53, 274, 161, 515, 75, 100, 146, 268, 58, 29, 193, 517, 77, 152, 112, 273, 576, 86, 57, 290, 196, 522, 83, 168, 54, 135, 266, 518, 276, 78, 164, 89, 529, 139, 289, 43, 101, 194, 322, 60, 524, 141, 296, 99, 176, 640, 147, 92, 280, 200, 532, 106, 150, 324, 85, 521, 263, 31, 546, 142, 385, 163, 90, 208, 292, 108, 59, 153, 545, 267, 102, 530, 304, 113, 165, 577, 224, 62, 278, 328, 149, 170, 79, 400, 269, 536, 105, 768, 156, 321, 548, 114, 275, 195, 87, 386, 177, 584, 154, 270, 519, 166, 293, 116, 55, 197, 281, 560, 336, 91, 642, 525, 172, 202, 388, 103, 120, 284, 578, 294, 61, 531, 169, 552, 352, 209, 297, 180, 94, 277, 151, 644, 198, 392, 109, 323, 534, 282, 143, 523, 178, 216, 592, 298, 107, 770, 326, 201, 580, 547, 228, 117, 306, 155, 526, 641, 47, 291, 416, 184, 329, 167, 540, 118, 204, 300, 549, 157, 210, 769, 537, 340, 93, 387, 305, 271, 122, 448, 225, 325, 173, 554, 115, 656, 608, 312, 174, 338, 579, 533, 389, 279, 212, 111, 648, 330, 562, 179, 158, 394, 226, 308, 550, 199, 121, 581, 772, 283, 354, 538, 332, 181, 295, 561, 401, 205, 585, 232, 368, 124, 672, 556, 186, 396, 588, 301, 776, 110, 211, 337, 553, 646, 171, 240, 402, 596, 353, 286, 527, 206, 390, 182, 643, 564, 309, 784, 417, 63, 586, 213, 302, 344, 185, 331, 218, 649, 535, 285, 119, 593, 424, 356, 704, 307, 203, 568, 404, 229, 327, 159, 541, 594, 393, 452, 236, 188, 777, 555, 660, 609, 313, 217, 582, 800, 126, 418, 333, 227, 652, 360, 542, 299, 774, 341, 449, 310, 624, 214, 551, 175, 650, 408, 397, 612, 230, 771, 342, 314, 658, 563, 187, 464, 334, 220, 557, 123, 355, 248, 600, 391, 832, 420, 673, 583, 412, 345, 233, 680, 773, 645, 316, 207, 566, 610, 450, 395, 241, 95, 357, 786, 539, 189, 587, 339, 406, 234, 664, 362, 590, 706, 215, 303, 565, 780, 346, 616, 432, 657, 242, 403, 569, 364, 190, 785, 597, 558, 808, 456, 674, 311, 348, 221, 398, 244, 708, 653, 778, 602, 369, 589, 422, 833, 315, 358, 676, 219, 570, 409, 802, 480, 611, 235, 896, 651, 421, 125, 335, 792, 572, 647, 688, 361, 598, 410, 287, 705, 372, 183, 451, 425, 788, 662, 238, 620, 595, 317, 405, 801, 347, 614, 543, 712, 661, 601, 222, 434, 370, 245, 454, 775, 654, 836, 419, 613, 457, 349, 675, 231, 567, 804, 428, 376, 720, 632, 665, 246, 604, 343, 781, 433, 897, 559, 363, 618, 243, 460, 426, 659, 318, 787, 681, 407, 237, 816, 626, 736, 466, 591, 678, 834, 399, 436, 359, 668, 617, 790, 453, 249, 488, 709, 574, 350, 782, 898, 625, 373, 465, 684, 603, 666, 250, 414, 793, 366, 440, 844, 127, 707, 482, 803, 573, 427, 840, 690, 677, 371, 779, 599, 458, 252, 411, 628, 468, 904, 805, 365, 714, 848, 429, 619, 689, 794, 191, 378, 605, 496, 806, 667, 435, 710, 481, 682, 900, 809, 615, 423, 722, 319, 655, 796, 737, 455, 251, 716, 377, 864, 472, 837, 413, 696, 606, 789, 438, 374, 621, 824, 663, 223, 692, 912, 459, 627, 721, 835, 484, 810, 430, 817, 571, 254, 441, 685, 740, 622, 713, 461, 380, 669, 842, 928, 467, 633, 728, 783, 375, 820, 630, 902, 683, 367, 444, 812, 470, 849, 247, 670, 899, 437, 724, 691, 838, 791, 473, 629, 486, 738, 818, 351, 679, 442, 850, 715, 462, 906, 865, 634, 797, 694, 905, 575, 483, 752, 381, 711, 807, 469, 960, 431, 841, 686, 490, 852, 744, 697, 914, 636, 476, 379, 868, 795, 717, 492, 908, 439, 819, 725, 814, 253, 623, 901, 474, 718, 489, 856, 693, 929, 813, 843, 607, 445, 723, 880, 700, 500, 382, 730, 798, 811, 475, 920, 839, 866, 443, 498, 739, 671, 826, 913, 698, 821, 471, 631, 741, 932, 463, 726, 845, 497, 872, 239, 916, 746, 853, 485, 687, 732, 822, 936, 760, 846, 638, 961, 729, 903, 504, 825, 858, 742, 487, 930, 695, 753, 415, 854, 867, 915, 637, 478, 962, 828, 910, 699, 748, 491, 873, 446, 719, 907, 944, 857, 870, 745, 493, 754, 917, 799, 635, 968, 851, 731, 477, 876, 701, 909, 815, 501, 931, 964, 860, 702, 924, 756, 494, 743, 881, 827, 869, 921, 733, 506, 934, 447, 976, 823, 874, 499, 918, 937, 847, 747, 505, 888, 734, 965, 922, 502, 882, 859, 749, 933, 829, 952, 727, 969, 479, 938, 757, 861, 884, 992, 830, 508, 948, 750, 871, 963, 945, 758, 255, 919, 875, 970, 639, 940, 761, 911, 862, 977, 383, 755, 966, 946, 855, 878, 923, 735, 883, 503, 972, 762, 935, 978, 889, 925, 993, 510, 764, 886, 941, 980, 877, 942, 751, 984, 507, 947, 926, 885, 967, 994, 703, 892, 831, 950, 971, 996, 953, 763, 890, 981, 863, 939, 974, 759, 1000, 956, 879, 949, 979, 765, 973, 1008, 954, 893, 986, 495, 995, 982, 927, 887, 997, 985, 766, 1002, 951, 988, 943, 891, 1001, 998, 957, 894, 1009, 975, 1004, 509, 987, 958, 1010, 955, 999, 989, 1012, 983, 1006, 990, 1016, 511, 1003, 1005, 1011, 1013, 767, 1014, 1017, 895, 1018, 1015, 1020, 1019, 1007, 959, 1022, 1023, 991, 1021].

The values in the foregoing sequence are sequence numbers of polar channels. In some embodiments, a polar channel whose sequence number is 2 has lowest reliability, a polar channel whose sequence number is 4 has higher reliability than that of the polar channel whose sequence number is 2, and so on, and a polar channel whose sequence number is 1021 has highest reliability.

When a code length is 64 and a decoder list size is 8, a sequence of polar channel reliability sorted in ascending order is as follows:

[0, 4, 2, 1, 8, 16, 6, 9, 32, 3, 12, 17, 18, 10, 33, 20, 5, 24, 34, 14, 36, 19, 13, 40, 21, 22, 35, 25, 48, 26, 37, 11, 38, 28, 41, 42, 7, 49, 44, 29, 50, 30, 39, 52, 43, 27, 56, 45, 51, 46, 53, 23, 54, 57, 15, 58, 60, 55, 47, 31, 59, 63, 61, 62].

When a code length is 64 and a decoder list size is 2, a sequence of polar channel reliability sorted in ascending order is as follows:

[0, 2, 1, 4, 8, 16, 5, 3, 32, 10, 6, 17, 9, 12, 18, 33, 20, 34, 24, 11, 36, 13, 7, 40, 19, 21, 14, 48, 35, 25, 22, 37, 26, 38, 41, 28, 42, 49, 23, 44, 50, 15, 27, 52, 39, 30, 43, 56, 45, 51, 29, 46, 53, 57, 54, 58, 31, 60, 55, 47, 59, 63, 61, 62].

Reliability sequences, with other code lengths, that are obtained by transforming the foregoing sequences through extraction or extension also fall within the protection scope. In addition, the foregoing sequences are polar channel reliability sorting sequences with high performance at the corresponding code lengths and decoder list sizes. Embodiments performed after an order of a particular sequence number in the sequence is changed on this basis should also fall within the protection scope of this application.

In a communication system, two communication entities need to negotiate on whether to update code construction information for channel encoding. A network device and a terminal device are used as examples for description below. However, this application is not limited thereto, and may be alternatively applied to negotiation between terminal devices.

Figure 6:
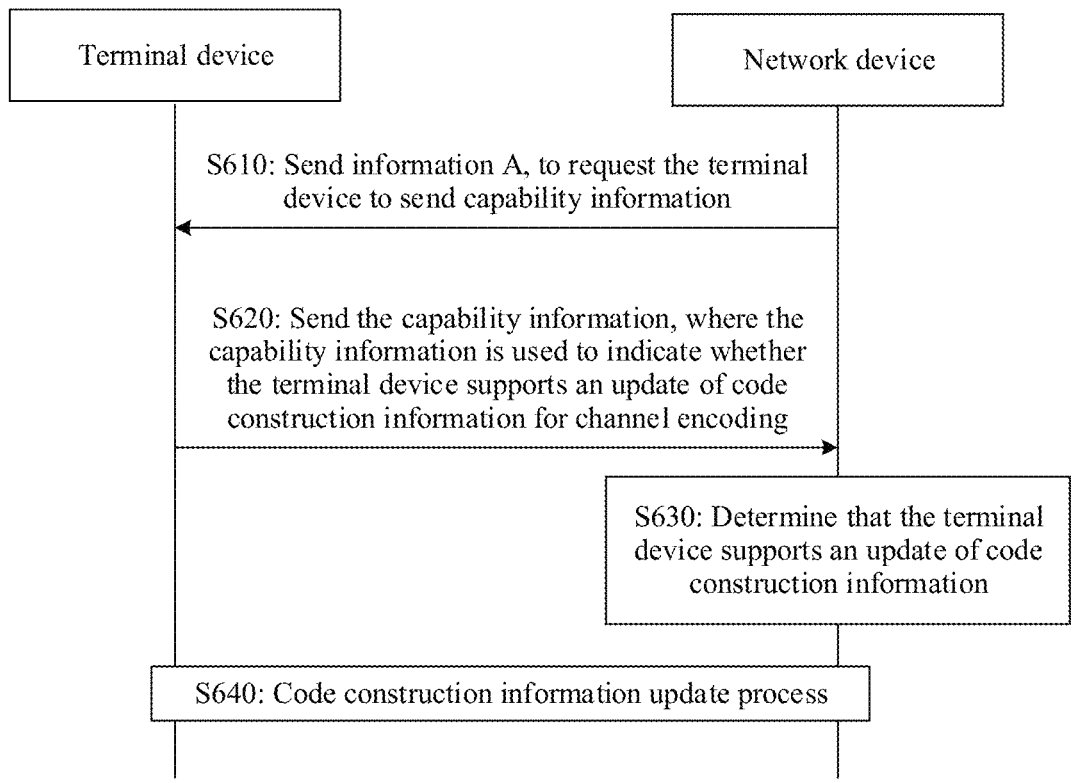
FIG. 6 is an example schematic flowchart of a communication method according to an embodiment of this application.

FIG. 6 is an example schematic flowchart of a communication method according to this application.

S610: A network device sends information A to a terminal device, to request capability information of the terminal device.

Correspondingly, the terminal device obtains the information A of the network device.

In some embodiments, the information A may be sent when a radio resource control (RRC) connection between the terminal device and the network device is established.

S620: The terminal device sends the capability information to the network device, where the capability information is used to indicate whether the terminal device supports an update of code construction information for channel encoding and decoding information.

Correspondingly, the network device obtains the capability information of the terminal device.

The capability information may include an enhanced code construction information field. For example, the field may be denoted as enhancedConstructionFlag. The field may indicate "0" or "1", or the field may indicate "true" or "false". For example, when the field indicates "1" or "true", it indicates that the terminal device supports an update of code construction information; or when the field indicates "0" or "false", it indicates that the terminal device does not support code construction information. However, this application is not limited thereto.

In some embodiments, when the terminal device indicates that an update of code construction information is supported in S620, the network device determines, based on the capability information, that the terminal device supports an update of code construction information in S630. In this case, the terminal device and the network device perform S640: a code construction information update process.

For example, the terminal device and the network device perform the process shown in FIG. 2. The terminal device may be the first communication apparatus in FIG. 2, and the network device may be the second communication apparatus in FIG. 2. After the terminal device provides the first parameter for the network device, the network device determines the first code construction information corresponding to the first parameter, and indicates the terminal device to update code construction information to the first code construction information. Alternatively, the terminal device may be the second communication apparatus in FIG. 2, and the network device may be the first communication apparatus in FIG. 2. After the network device provides the first parameter for the terminal device, the terminal device determines the first code construction information corresponding to the first parameter, and indicates the network device to update code construction information to the first code construction information. However, this application is not limited thereto.

As an example rather than a limitation, in this application, the first parameter sent by the first communication apparatus to the second communication apparatus may be referred to as a code construction information parameter set, which may be denoted as ConstructionRelatedParameters. The first parameter ConstructionRelatedParameters may include the following elements:

a decoder list size, where a value of the decoder list size is an integer and may be denoted as, for example, ListNum INTEGER(1 . . . 100);
a decoder list size distribution, used to indicate probabilities of invoking different decoder list sizes, where a value of the decoder list size distribution may be an integer and may be denoted as, for example, ListNumFreq INTEGER(1 . . . 100);
a quantity of iterations of a decoder, where a value of the quantity of iterations is an integer and may be denoted as, for example, IterationNum INTEGER(1 . . . 100);
a distribution of a quantity of iterations of a decoder, where a value of the distribution is an integer and may be denoted as, for example:
IterationFreq INTEGER(1 . . . 100);
an encoding length set, where a value of the encoding length set is an integer and may be denoted as, for example, CodeLength INTEGER(1 . . . 100);
an encoding length distribution, used to indicate an invocation probability corresponding to an encoding length, where a value of the encoding length distribution may be an integer and may be denoted as, for example, CodeLengthFreq INTEGER(1 . . . 100);
an information bit length set, where a value of the information bit length set is an integer and may be denoted as, for example, InfoLength INTEGER(1 . . . 100);
an information bit length distribution, used to indicate a probability of invoking an information bit length, where a value of the information bit length distribution may be an integer and may be denoted as, for example, InfoLengthFreq INTEGER(1 . . . 100);
an SNR range of a decoder, where a value of the range is an integer: SNRRegion INTEGER(1 . . . 100);
an SNR range distribution of a decoder, used to indicate a probability that an SNR range of a decoder appears, where a value of the SNR range distribution may be an integer and may be denoted as, for example, SNRRegionFreq INTEGER(1 . . . 100); and
a BLER of a decoding result, where a value of the BLER may be an integer and may be denoted as, for example, BLER INTEGER(1 . . . 100).

According to the foregoing solution, the two communication entities determine, by exchanging information, whether code construction information can be updated, so that the two communication entities can reach an agreement on a communication capability. Therefore, when code construction information can be updated, the code construction information is updated to improve communication reliability.

When the first communication apparatus and the second communication apparatus, for example, the terminal device and the network device, perform channel encoding by using updated code construction information, performance of the code construction information may deteriorate due to a change of a channel environment or the like. In this case, the code construction information may be updated again according to the foregoing process. In addition, this application further proposes a code construction information rollback mechanism.

Figure 7:
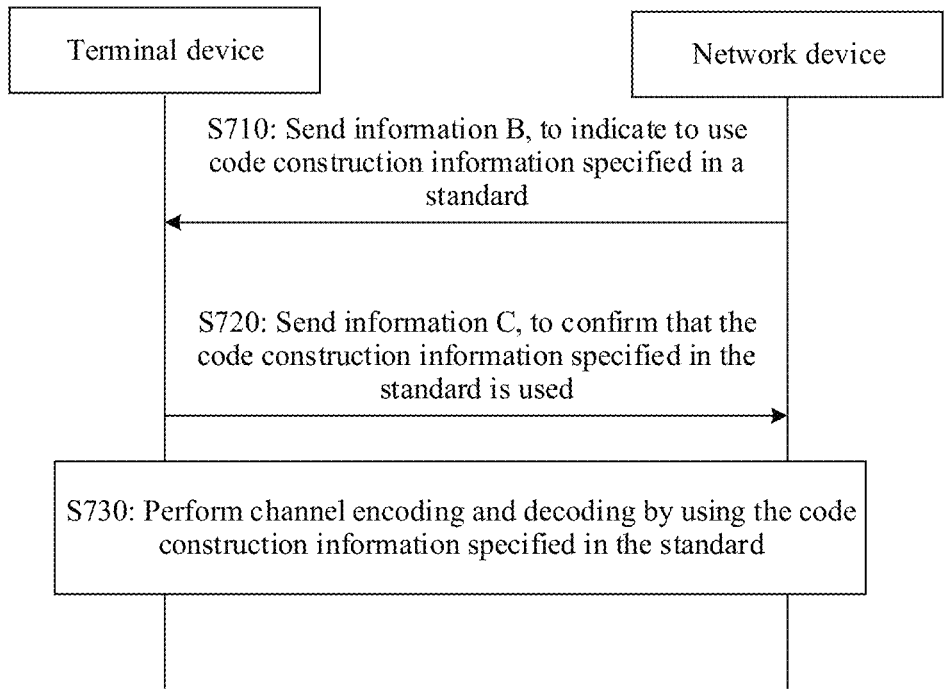
FIG. 7 is another example schematic flowchart of a communication method according to an embodiment of this application.

FIG. 7 is another example schematic flowchart of a communication method according to an embodiment of this application.

S710: A network device sends information B to a terminal device, where the information B is used to indicate to use code construction information specified in a protocol.

Correspondingly, the terminal device obtains the information B of the network device. The network device may send the information B to the terminal device when determining that communication quality deteriorates after updated first code construction information is used, or when determining that channel encoding is to be performed by using a first parameter different from that corresponding to currently used first code construction information, to indicate the terminal device to perform channel encoding and decoding by using the code construction information specified in the protocol.

S720: The terminal device sends information C to the network device, to confirm that the code construction information specified in the protocol is to be used.

Correspondingly, the network device obtains the information C of the terminal device. After obtaining the information B of the network device, if the terminal device determines to use the code construction information specified in the protocol, the terminal device sends the information C to the network device.

S730: The terminal device and the network device perform channel encoding and decoding by using the code construction information specified in the protocol.

After the terminal device sends the information C, correspondingly, after receiving the information C, the network device confirms that the two communication entities have reached an agreement on understanding, and the two communication entities start to perform channel encoding and decoding by using the code construction information specified in the protocol.

It should be noted that the foregoing protocol may be a communication standardization protocol. In addition, in this embodiment, an example in which the network device confirms that code construction information is changed to the code construction information specified in the protocol is used for description. Alternatively, in the method, the terminal device may initiate a process of updating code construction information. In some embodiments, the terminal device sends information for requesting to perform channel encoding by using the code construction information specified in the protocol. After receiving the information, the network device determines whether to agree; and when agreeing to performing an update to the code construction information specified in the protocol, sends acknowledgement information to the terminal device, to complete a rollback to performing channel encoding and decoding by using the code construction information specified in the protocol.

According to the foregoing solution, when finding that performance of code construction information deteriorates or a channel encoding parameter changes, a communication device supporting an update of code construction information may change the code construction information to the code construction information specified in the protocol through information exchange and negotiation, so that communication performance is maintained at a corresponding level, and communication reliability is improved.

It should be understood that sequence numbers of the processes do not mean execution sequences in the foregoing embodiments. The execution sequences of the processes should be determined according to functions and internal logic of the processes.

The foregoing describes in detail the methods provided in embodiments of this application with reference to FIG. 2 to FIG. 7. The following describes in detail apparatuses provided in embodiments of this application with reference to FIG. 8 to FIG. 10.

Figure 8:
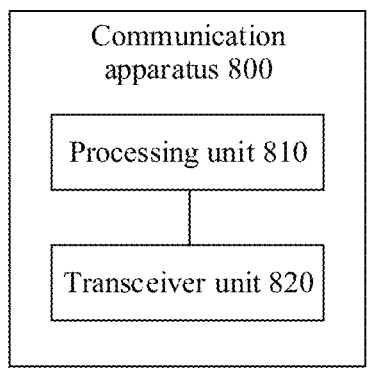
FIG. 8 is an example schematic block diagram of a communication apparatus according to this application.

FIG. 8 is a schematic block diagram of a communication apparatus according to an embodiment of this application. As shown in FIG. 8, the communication apparatus 800 may include a processing unit 810 and a transceiver unit 820.

In some embodiments, the communication apparatus 800 may correspond to the first communication apparatus in the foregoing method embodiments. The first communication apparatus may be a terminal device or a chip configured in a terminal device, or the first communication apparatus may be a network device or a chip configured in a network device.

It should be understood that the communication apparatus 800 may correspond to the first communication apparatus in the method 200 according to an embodiment of this application, and the communication apparatus 800 may include units configured to perform the method performed by the first communication apparatus in the method 200 in FIG. 2. In addition, the units in the communication apparatus 800 and the foregoing other operations and/or functions are separately used to implement corresponding processes of the method 200 in FIG. 2.

When the communication apparatus 800 is configured to perform the method 200 in FIG. 2, the transceiver unit 820 may be configured to perform S210 and S230 in the method 200. When the communication apparatus 800 is configured to perform the method 300 in FIG. 2, the transceiver unit 820 may be configured to perform S320 in the method 600, and the processing unit 810 may be configured to perform S310 in the method 300. It should be understood that a process in which the units perform the foregoing corresponding operations has been described in detail in the foregoing method embodiments. For brevity, details are not described herein again.

In some embodiments, the communication apparatus 800 may correspond to the second communication apparatus in the foregoing method embodiments. The second communication apparatus may be a terminal device or a chip configured in a terminal device, or the second communication apparatus may be a network device or a chip configured in a network device.

It should be understood that the communication apparatus 800 may correspond to the second communication apparatus in the method 200 according to an embodiment of this application, and the communication apparatus 800 may include units configured to perform the method performed by the second communication apparatus in the method 200 in FIG. 2. In addition, the units in the communication apparatus 800 and the foregoing other operations and/or functions are separately used to implement corresponding processes of the method 200 in FIG. 2.

When the communication apparatus 800 is configured to perform the method 200 in FIG. 2, the transceiver unit 820 may be configured to perform S210 and S230 in the method 200, and the processing unit 810 may be configured to perform S220 in the method 200. It should be understood that a process in which the units perform the foregoing corresponding operations has been described in detail in the foregoing method embodiments. For brevity, details are not described herein again.

In some embodiments, the communication apparatus 800 may correspond to the terminal device in the foregoing method embodiments. For example, the communication apparatus 800 may be the terminal device or a chip configured in the terminal device.

It should be understood that the communication apparatus 800 may correspond to the terminal device in the methods 600 and 700 according to embodiments of this application, and the communication apparatus 800 may include units configured to perform the methods performed by the terminal device in the methods 600 and 700 in FIG. 6 and FIG. 7. In addition, the units in the communication apparatus 800 and the foregoing other operations and/or functions are separately used to implement corresponding processes of the methods 600 and 700 in FIG. 6 and FIG. 7.

When the communication apparatus 800 is configured to perform the method 600 in FIG. 6, the transceiver unit 820 may be configured to perform S610, S620, and S640 in the method 600, and the processing unit 810 may be configured to perform S640 in the method 600. When the communication apparatus 800 is configured to perform the method 700 in FIG. 7, the transceiver unit 820 may be configured to perform S710, S720, and 730 in the method 700, and the processing unit 810 may be configured to perform S730 in the method 300. It should be understood that a process in which the units perform the foregoing corresponding operations has been described in detail in the foregoing method embodiments. For brevity, details are not described herein again.

Figure 9:
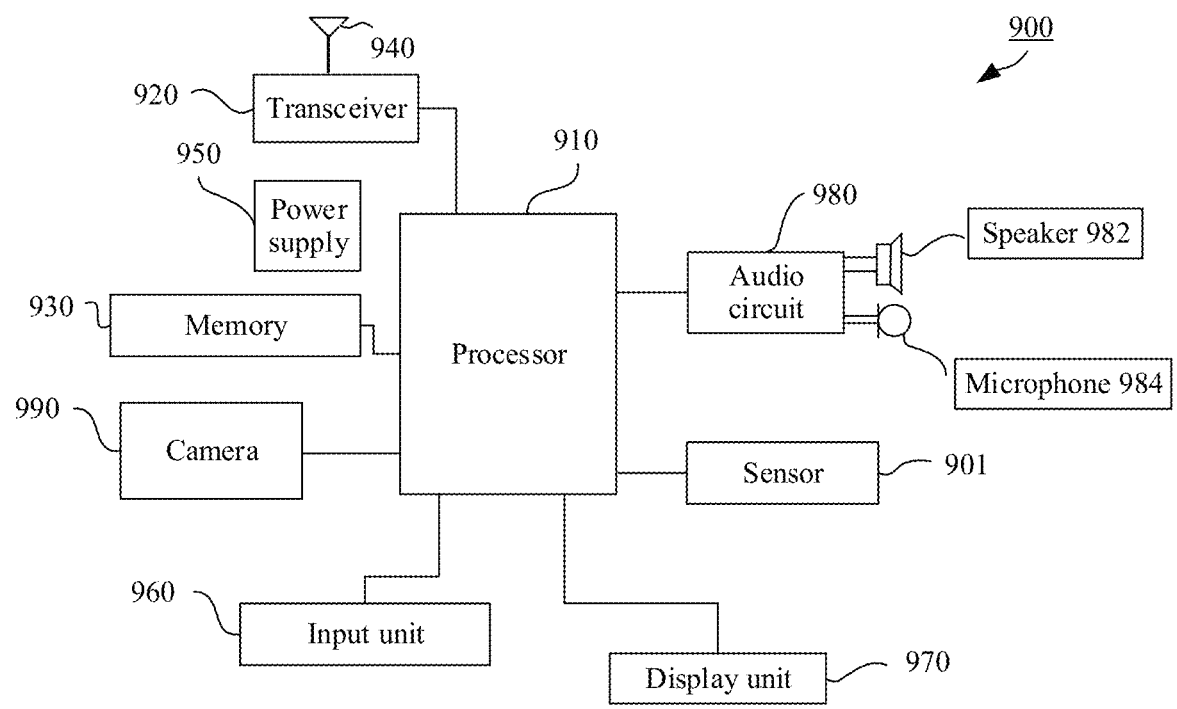
FIG. 9 is an example schematic diagram of a structure of a terminal device according to this application.

It should be further understood that, when the communication apparatus 800 is a terminal device, the transceiver unit 820 in the communication apparatus 800 may correspond to a transceiver 920 in a terminal device 900 shown in FIG. 9, and the processing unit 810 in the communication apparatus 800 may correspond to a processor 910 in the terminal device 900 shown in FIG. 9.

It should be further understood that, when the communication apparatus 800 is a terminal device, the transceiver unit 820 in the communication apparatus 800 may be implemented by using a communication interface (for example, a transceiver or an input/output interface), for example, the transceiver unit 820 may correspond to the transceiver 920 in the terminal device 900 shown in FIG. 9; and the processing unit 810 in the communication apparatus 800 may be implemented by using at least one processor, for example, the processing unit 810 may correspond to the processor 910 in the terminal device 900 shown in FIG. 9;

or the processing unit 810 in the communication apparatus 800 may be implemented by using at least one logic circuit.

In some embodiments, the communication apparatus 800 may further include the processing unit 810. The processing unit 810 may be configured to process instructions or data, to implement a corresponding operation.

In some embodiments, the communication apparatus 800 may further include a storage unit. The storage unit may be configured to store instructions or data. The processing unit may invoke the instructions or the data stored in the storage unit, to implement a corresponding operation.

It should be understood that a process in which the units perform the foregoing corresponding operations has been described in detail in the foregoing method embodiments. For brevity, details are not described herein again.

In some embodiments, the communication apparatus 800 may correspond to the network device in the foregoing method embodiments. For example, the communication apparatus 800 may be the network device or a chip configured in the network device.

It should be understood that the communication apparatus 800 may correspond to the network device in the methods 600 and 700 according to embodiments of this application, and the communication apparatus 800 may include units configured to perform the methods performed by the network device in the methods 600 and 700 in FIG. 6 and FIG. 7. In addition, the units in the communication apparatus 800 and the foregoing other operations and/or functions are separately used to implement corresponding processes of the methods 600 and 700 in FIG. 6 and FIG. 7.

When the communication apparatus 800 is configured to perform the method 600 in FIG. 6, the transceiver unit 820 may be configured to perform S610, S620, and S640 in the method 600, and the processing unit 810 may be configured to perform S630 and S640 in the method 600. When the communication apparatus 800 is configured to perform the method 700 in FIG. 7, the transceiver unit 820 may be configured to perform S710, S720, and S730 in the method 700, and the processing unit 810 may be configured to perform S730 in the method 700. It should be understood that a process in which the units perform the foregoing corresponding operations has been described in detail in the foregoing method embodiments. For brevity, details are not described herein again.

Figure 10:
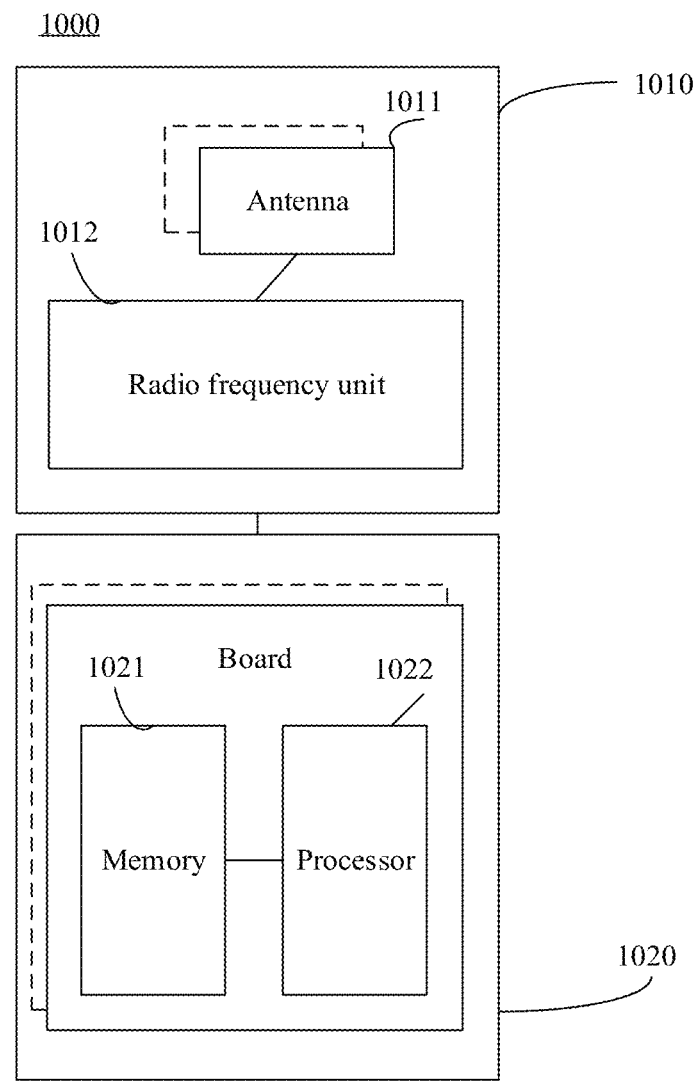
FIG. 10 is an example schematic diagram of a structure of a network device according to this application.

It should be further understood that, when the communication apparatus 800 is a network device, the transceiver unit in the communication apparatus 800 may correspond to a transceiver 1010 in a network device 1000 shown in FIG. 10, and the processing unit 810 in the communication apparatus 800 may correspond to a processor 1022 in the network device 1000 shown in FIG. 10.

In some embodiments, the communication apparatus 800 may further include the processing unit 810. The processing unit 810 may be configured to process instructions or data, to implement a corresponding operation.

In some embodiments, the communication apparatus 800 may further include a storage unit. The storage unit may be configured to store instructions or data. The processing unit may invoke the instructions or the data stored in the storage unit, to implement a corresponding operation.

It should be understood that a process in which the units perform the foregoing corresponding operations has been described in detail in the foregoing method embodiments. For brevity, details are not described herein again.

It should be further understood that, when the communication apparatus 800 is a network device, the transceiver unit 820 in the communication apparatus 800 may be implemented by using a communication interface (for example, a transceiver or an input/output interface), for example, the transceiver unit 820 may correspond to the transceiver 1010 in the network device 1000 shown in FIG. 10; and the processing unit 810 in the communication apparatus 800 may be implemented by using at least one processor, for example, the processing unit 810 may correspond to the processor 1022 in the network device 1000 shown in FIG. 10; or the processing unit 810 in the communication apparatus 800 may be implemented by using at least one logic circuit.

FIG. 9 is a schematic diagram of a structure of a terminal device 900 according to an embodiment of this application. The terminal device 900 may be used in the system shown in FIG. 1, to perform the functions of the terminal device in the foregoing method embodiments. As shown in the figure, the terminal device 900 includes a processor 910 and a transceiver 920. In some embodiments, the terminal device 900 further includes a memory 930. The processor 910, the transceiver 920, and the memory 930 may communicate with each other through an internal connection path, and transfer a control signal and/or a data signal. The memory 930 is configured to store a computer program, and the processor 910 is configured to invoke the computer program from the memory 930 and run the computer program, to control the transceiver 920 to transmit or receive a signal. In some embodiments, the terminal device 900 may further include an antenna 940, configured to send, by using a radio signal, uplink data or uplink control signaling output by the transceiver 920.

The processor 910 and the memory 930 may be combined into one processing apparatus, and the processor 910 is configured to execute program code stored in the memory 930 to implement the foregoing functions. In some embodiments, the memory 930 may be alternatively integrated in the processor 910, or may be independent of the processor 910. The processor 910 may correspond to the processing unit in FIG. 8.

The transceiver 920 may correspond to the transceiver unit in FIG. 8. The transceiver 920 may include a receiver (or referred to as a receiver machine or a receiver circuit) and a transmitter (or referred to as a transmitter machine or a transmitter circuit). The receiver is configured to receive a signal, and the transmitter is configured to transmit a signal.

It should be understood that the terminal device 900 shown in FIG. 9 can implement the processes related to the terminal device in the method embodiments shown in FIG. 2, FIG. 6, and FIG. 7. The operations and/or the functions of the modules in the terminal device 900 are separately used to implement corresponding processes in the foregoing method embodiments. For details, refer to the descriptions in the foregoing method embodiments. To avoid repetition, detailed descriptions are appropriately omitted herein.

The processor 910 may be configured to perform an action that is implemented inside the terminal device and that is described in the foregoing method embodiments. The transceiver 920 may be configured to perform a sending action by the terminal device for the network device or a receiving operation from the network device in the foregoing method embodiments. For details, refer to the descriptions in the foregoing method embodiments. Details are not described herein again.

In some embodiments, the terminal device 900 may further include a power supply 950, configured to supply power to various devices or circuits in the terminal device.

In addition, to improve functions of the terminal device, the terminal device 900 may further include one or more of an input unit 960, a display unit 970, an audio circuit 980, a camera 990, a sensor 901, and the like. The audio circuit may further include a speaker 982, a microphone 984, and the like.

FIG. 10 is a schematic diagram of a structure of a network device according to an embodiment of this application, for example, a schematic diagram of a related structure of the network device.

It should be understood that the network device 1000 shown in FIG. 10 can implement the processes related to the network device in the method embodiments shown in FIG. 2, FIG. 6, and FIG. 7. The operations and/or the functions of the modules in the network device 1000 are separately used to implement corresponding processes in the foregoing method embodiments. For details, refer to the descriptions in the foregoing method embodiments. To avoid repetition, detailed descriptions are appropriately omitted herein.

It should be understood that the network device 1000 shown in FIG. 10 is merely a possible architecture of the network device, and should not constitute any limitation on this application. The methods provided in this application are applicable to a network device with another architecture, for example, a network device including a CU, a DU, and an AAU.

An embodiment of this application further provides a processing apparatus, including a logic circuit and a communication interface. The communication interface is configured to receive a signal input to the processing apparatus, or output a processed signal from the chip. The logic circuit processes the signal input to the chip and generates the processed signal according to the method in any one of the foregoing method embodiments.

It should be understood that the processing apparatus may be one or more chips. For example, the processing apparatus may be a field programmable gate array (FPGA), an application-specific integrated chip (ASIC), a system on chip (SoC), a central processing unit (CPU), a network processor (NP), a digital signal processor (DSP), a micro controller unit (MCU), a programmable controller (PLD), or another integrated chip.

In some embodiments, operations in the foregoing methods can be implemented by using a hardware integrated logical circuit in the processor, or by using instructions in a form of software. The operations of the method disclosed with reference to embodiments of this application may be directly performed by a hardware processor, or may be performed by using a combination of hardware in the processor and a software module. A software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the operations in the foregoing methods in combination with hardware of the processor. To avoid repetition, details are not described herein again.

It should be noted that, the processor in embodiments of this application may be an integrated circuit chip, and has a signal processing capability. Operations in the foregoing method embodiments can be implemented by using a hardware integrated logical circuit in the processor, or by using instructions in a form of software. The processor may be a general purpose processor, a digital signal processor (DSP), an application specific integrated circuit (ASIC), a field programmable gate array (FPGA) or another programmable logic device, a discrete gate or a transistor logic device, or a discrete hardware component. It may implement or perform the methods, the operations, and logical block diagrams that are disclosed in embodiments of this application. The general-purpose processor may be a microprocessor, or the processor may be any conventional processor or the like. Operations of the methods disclosed with reference to embodiments of this application may be directly executed and accomplished by means of a hardware decoding processor, or may be executed and accomplished by using a combination of hardware and software modules in the decoding processor. A software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the operations in the foregoing methods in combination with hardware of the processor.

It may be understood that the memory in this embodiment of this application may be a volatile memory or a nonvolatile memory, or may include a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM), used as an external cache. Through example but not limitative description, many forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchronous link dynamic random access memory (SLDRAM), and a direct rambus dynamic random access memory (DR RAM). It should be noted that the memory of the systems and methods described in this specification includes but is not limited to these and any memory of another proper type.

According to the methods provided in embodiments of this application, this application further provides a computer program product. The computer program product includes computer program code. When the computer program code is run on a computer, the computer is enabled to perform the methods in the embodiments shown in FIG. 2, FIG. 6, and FIG. 7.

According to the methods provided in embodiments of this application, this application further provides a computer-readable medium. The computer-readable medium stores program code. When the program code is run on a computer, the computer is enabled to perform the methods in the embodiments shown in FIG. 2, FIG. 6, and FIG. 7.

According to the method provided in embodiments of this application, this application further provides a system. The system includes the foregoing one or more terminal devices and the foregoing one or more network devices.

The network device and the terminal device in the apparatus embodiments exactly correspond to the network device or the terminal device in the method embodiments, and corresponding modules or units perform corresponding operations. For example, a communication unit (a transceiver) performs a sending or receiving operation in the method embodiments, and operations other than sending and receiving may be performed by a processing unit (a processor).

All or some of the foregoing embodiments may be implemented by using software, hardware, firmware, or any combination thereof. When software is used to implement the embodiments, all or a part of the embodiments may be implemented in a form of a computer program product. The computer program product includes one or more computer instructions. When the computer instructions are loaded and executed on the computer, the procedure or functions according to the embodiments of this application are all or partially generated. The computer may be a general-purpose computer, a dedicated computer, a computer network, or other programmable apparatuses. The computer instructions may be stored in a computer-readable storage medium or may be transmitted from one computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk drive, or a magnetic tape), an optical medium (for example, a high-density digital video disc (DVD)), a semiconductor medium (for example, a solid-state drive (SSD)), or the like.

The network device and the terminal device in the apparatus embodiments exactly correspond to the network device or the terminal device in the method embodiments, and corresponding modules or units perform corresponding operations. For example, a communication unit (a transceiver) performs a sending or receiving operation in the method embodiments, and operations other than sending and receiving may be performed by a processing unit (a processor).

Terminologies such as "component", "module", and "system" used in this specification are used to indicate computer-related entities, hardware, firmware, combinations of hardware and software, software, or software being executed. For example, a component may be, but is not limited to, a process that runs on a processor, a processor, an object, an executable file, an execution thread, a program, and/or a computer. As illustrated by using figures, both a computing device and an application that runs on the computing device may be components. One or more components may reside within a process and/or a thread of execution, and a component may be located on one computer and/or distributed between two or more computers. In addition, these components may be executed from various computer-readable media that store various data structures. For example, the components may communicate by using a local and/or remote process and based on, for example, a signal having one or more data packets (for example, data from two components interacting with another component in a local system, a distributed system, and/or across a network such as the Internet interacting with other systems by using the signal).

A person of ordinary skill in the art may be aware that, in combination with the examples described in embodiments disclosed in this specification, units and algorithm operations may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, function units in embodiments of this application may be integrated into one processing unit, or each of the units may exist alone physically, or two or more units are integrated into one unit.

In the foregoing embodiments, all or some of the functions of the function units may be implemented by using software, hardware, firmware, or any combination thereof. When software is used to implement the embodiments, all or a part of the embodiments may be implemented in a form of a computer program product. The computer program product includes one or more computer instructions (programs). When the computer program instructions (programs) are loaded and executed on the computer, the procedure or functions according to embodiments of this application are all or partially generated. The computer may be a general-purpose computer, a dedicated computer, a computer network, or other programmable apparatuses. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive (SSD)), or the like.

When the functions are implemented in the form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions to enable a computer device (which may be a personal computer, a server, a network device, or the like) to perform all or some of the operations of the method described in embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely embodiments of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A communication method, comprising:
   sending, by a first communication apparatus, a first parameter to a second communication apparatus, wherein the first parameter comprises a parameter related to channel encoding and decoding and a reinforcement learning training parameter;
   obtaining, by the first communication apparatus, exploration code construction information of the second communication apparatus, wherein the exploration code construction information corresponds to the first parameter;
   sending, by the first communication apparatus, performance information of the exploration code construction information to the second communication apparatus; and
   obtaining, by the first communication apparatus, first code construction information of the second communication apparatus, wherein the first code construction information corresponds to the performance information and the first parameter, and the first code construction information is used to construct a coded bit based on an information bit during channel encoding.

2. The method according to claim 1, wherein the first code construction information is a polar channel reliability sorting sequence of a polar code or a base matrix of low-density parity-check code LDPC.

3. The method according to claim 1, wherein the first code construction information is obtained by using a reinforcement learning method.

4. The method according to claim 3, wherein before obtaining, by the first communication apparatus, the first code construction information, the method further comprises:
   assessing, by the first communication apparatus, performance of the exploration code construction information, and generating the performance information of the exploration code construction information based on the first parameter.

5. The method according to claim 1, wherein the method further comprises:
   sending, by the first communication apparatus, capability information to the second communication apparatus, wherein the capability information is used to indicate whether the first communication apparatus supports an update of code construction information.

6. The method according to claim 1, wherein the channel encoding is channel encoding for one or more of the following communication information:
   uplink data, downlink data, uplink control information, downlink control information, sidelink data, or sidelink control information.

7. The method according to claim 1, wherein the parameter related to channel encoding and decoding comprises one or more of the following:
   channel state information (CSI), precoding matrix information (PMI), an encoding length, an information bit length, a code rate, or a modulation order.

8. The method according to claim 1, wherein the reinforcement learning training parameter comprises one or more of:
   a modulation order distribution, an encoding length distribution, a code rate distribution, an information bit length distribution, a codec parameter, a channel feature parameter, or a decoding result.

9. A communication apparatus, comprising:
   a processor, configured to determine a first parameter, wherein the first parameter comprises a parameter related to channel encoding and decoding and a reinforcement learning training parameter; and
   a transceiver, configured to;
   send the first parameter to a second communication apparatus;
   obtain exploration code construction information of the second communication apparatus, wherein the exploration code construction information corresponds to the first parameter;
   send performance information of the exploration code construction information to the second communication apparatus; and
   obtain first code construction information of the second communication apparatus, wherein the first code construction information corresponds to the first parameter, and the first code construction information is used to construct a coded bit based on an information bit during channel encoding.

10. The apparatus according to claim 9, wherein the first code construction information is a polar channel reliability sorting sequence of a polar code or a base matrix of low-density parity-check code (LDPC).

11. The apparatus according to claim 9, wherein the first code construction information is obtained by using a reinforcement learning method.

12. The apparatus according to claim 9, wherein
   the processor is further configured to assess performance of the exploration code construction information, and generate performance information of the exploration code construction information based on the first parameter.

13. The apparatus according to claim 9, wherein
   the transceiver is further configured to send capability information to the second communication apparatus, wherein the capability information is used to indicate whether an update of code construction information is supported.

14. The apparatus according to claim 9, wherein the channel encoding is channel encoding for one or more of the following communication information:
   uplink data, downlink data, uplink control information, downlink control information, sidelink data, or sidelink control information.

15. The apparatus according to claim 9, wherein the parameter related to channel encoding and decoding comprises one or more of the following:
channel state information (CSI), precoding matrix information (PMI), an encoding length, an information bit length, a code rate, or a modulation order.

16. The apparatus according to claim 9, wherein the reinforcement learning training parameter comprises one or more of:
a modulation order distribution, an encoding length distribution, a code rate distribution, an information bit length distribution, a codec parameter, a channel feature parameter, or a decoding result.

17. A communication apparatus, comprising:
a transceiver, configured to obtain a first parameter of a first communication apparatus, wherein the first parameter comprises a parameter related to channel encoding and decoding and a reinforcement learning training parameter; and
a processor, configured to;
generate exploration code construction information based on the first parameter;
determine first code construction information based on the first parameter and the exploration code construction information, wherein the first code construction information is used to construct a coded bit sequence based on an information bit sequence during channel encoding; and
the transceiver is further configured to send the first code construction information to the first communication apparatus.

18. The apparatus according to claim 17, wherein the first code construction information is a polar channel reliability sorting sequence of a polar code or a base matrix of low-density parity-check code (LDPC).

19. The apparatus according to claim 17, wherein
the transceiver or the processor is further configured to obtain performance information of the exploration code construction information;
the processor is further configured to train a code construction information generation model by using the performance information as a reward; and
the processor generates the first code construction information by using a trained code construction information generation model.

20. The apparatus according to claim 19, wherein the processor is further configured to obtain performance information of the exploration code construction information comprises:
the processor is configured to assess performance of the exploration code construction information, and generate performance information of the exploration code construction information based on the first parameter.

* * * * *